(12) United States Patent
Lee et al.

(10) Patent No.: US 12,720,969 B2
(45) **Date of Patent: *Aug. 25, 2026**

(54) ORGANIC LIGHT EMITTING PANEL AND ORGANIC LIGHT EMITTING DISPLAY DEVICE

(71) Applicant: LG DISPLAY CO., LTD., Seoul (KR)

(72) Inventors: HyunHaeng Lee, Paju-si (KR); Kiwoong Song, Paju-si (KR)

(73) Assignee: LG Display Co., Ltd. (KR)

( * ) Notice: Subject to any disclaimer, the term of this patent is extended or adjusted under 35 U.S.C. 154(b) by 235 days.

This patent is subject to a terminal disclaimer.

(21) Appl. No.: 17/533,669

(22) Filed: Nov. 23, 2021

(65) Prior Publication Data

US 2022/0199717 A1 Jun. 23, 2022

(30) Foreign Application Priority Data

Dec. 18, 2020 (KR) ........................ 10-2020-0178383

(51) Int. Cl.
*H10K 59/123* (2023.01)
*H10K 59/121* (2023.01)

(52) U.S. Cl.
CPC ....... *H10K 59/123* (2023.02); *H10K 59/1216* (2023.02)

(58) Field of Classification Search
CPC ......................... H10K 59/123; H10K 59/1216
(Continued)

(56) References Cited

U.S. PATENT DOCUMENTS 5,893,752 A * 4/1999 Zhang ............... H01L 23/53238 257/E21.585
7,501,756 B2 * 3/2009 Kim ..................... H10D 86/451 313/506
(Continued)

FOREIGN PATENT DOCUMENTS

CN 104220926 A 12/2014
CN 108242457 A 7/2018
(Continued)

OTHER PUBLICATIONS

Office Action in Korean Appln. No. 10-2020-0178383, mailed on Jun. 19, 2025, 27 pages (with English translation).
(Continued)

*Primary Examiner* — Ori Nadav
(74) *Attorney, Agent, or Firm* — Fish & Richardson P.C.

(57) ABSTRACT

An organic light emitting display panel and an organic light emitting display device including the display panel that includes a buffer layer disposed on a first conductive layer, and including a first contact hole overlapping a part of the first conductive layer, an active layer disposed on the buffer layer, a first insulating film disposed on the active layer and the buffer layer, and including a second contact hole overlapping the first contact hole, a second insulating film disposed over the first insulating film, and including a third contact hole overlapping a part of each of the first contact hole and the second contact hole, and a third conductive layer disposed on the second insulating film, and contacting a part of the second conductive layer through the second contact hole. The third contact hole does not overlap with the active layer. The organic light emitting display panel including a high-capacity storage capacitor and the organic light emitting display device including the display panel can be provided.

19 Claims, 12 Drawing Sheets

(58) Field of Classification Search
USPC ........................................................... 257/40
See application file for complete search history.

(56) References Cited

U.S. PATENT DOCUMENTS

| | | | | |
|---|---|---|---|---|
| 11,864,429 | B2 * | 1/2024 | Lee | H10K 59/1216 |
| 2011/0073880 | A1 * | 3/2011 | Lee | C03C 23/0025 257/88 |
| 2017/0062545 | A1 | 3/2017 | Oh et al. | |
| 2017/0293190 | A1 * | 10/2017 | Kim | G02F 1/136227 |
| 2018/0182836 | A1 * | 6/2018 | Beak | H10K 59/1216 |
| 2020/0098841 | A1 | 3/2020 | Song et al. | |

FOREIGN PATENT DOCUMENTS

| | | | |
|---|---|---|---|
| CN | 109273498 | A | 1/2019 |
| KR | 20110101907 | A | 9/2011 |
| KR | 20160036418 | A | 4/2016 |
| KR | 20160043327 | A | 4/2016 |
| KR | 20180075056 | A | 7/2018 |

OTHER PUBLICATIONS

Office Action in Chinese Appln. No. 202111499773.5, mailed on Jan. 28, 2026, 16 pages (with English translation).

* cited by examiner

X
Y
Z
EA
T1
Cst
T2
T3
305
345
300
302
310
337
380
370
335a
335
335b
339
360
440
340
304
CH1
330
342
341
CH2
303
301
K
442
430
435
A ratio of light emitting area
47%
Cst capacity
274fF
A ratio of light emitting area
47%
Cst capacity
348fF
A ratio of light emitting area
50%
Cst capacity
274fF

ORGANIC LIGHT EMITTING PANEL AND ORGANIC LIGHT EMITTING DISPLAY DEVICE

CROSS-REFERENCE TO RELATED APPLICATION

This application claims the priority benefit of Republic of Korea Patent Application No. 10-2020-0178383, filed on Dec. 18, 2020, which is hereby incorporated by reference in its entirety.

BACKGROUND

Field of the Disclosure

The present disclosure relates to an organic light emitting display panel and an organic light emitting display device including the display panel.

Description of the Background

Organic light emitting display devices include one or more thin film transistors (TFT), a storage capacitor, and a plurality of lines.

One or more thin film transistors, a capacitor, and one or more lines are sometimes implemented as fine patterns on substrate included in the organic light emitting display device, and the display device can operate based on complicate connections between one or more thin film transistors, at least one capacitor, and one or more lines.

Recently, there are growing needs for organic light emitting display devices with high luminance and high resolution, and to satisfy such needs, it is desirable to implement an efficient space arrangement and connection structure between elements included in the organic light emitting display devices is in progress.

SUMMARY

The present disclosure relate to an organic light emitting display panel having high luminance characteristics by increasing an area of a light emitting area without reducing an area of a storage capacitor disposed in a non-light emitting area, and an organic light emitting display device including the display panel.

Further, the present disclosure relates to an organic light emitting display panel having high luminance and high resolution by increasing the capacity of a storage capacitor without reducing an area of a light emitting area, and an organic light emitting display device including the display panel.

Further, the present disclosure relates to an organic light emitting display panel for easily driving sub-pixels by enabling an active layer to include an active pattern and a conductive pattern, and an organic light emitting display device including the display panel.

Further, the present disclosure relates to an organic light emitting display panel having a structure capable of preventing an active layer or a buffer layer from being damaged in an associated process by disposing the active layer not to overlap a part of an area in which a plurality of contact holes are formed, and an organic light emitting display device including the display panel.

In according to one aspect of the present disclosure, an organic light emitting display panel and an organic light emitting display device including the display panel, the display panel including: a substrate, a first conductive layer disposed on the substrate, a buffer layer disposed on the first conductive layer, and including a first contact hole overlapping a part of the first conductive layer, an active layer disposed on or over the buffer layer, a first insulating film disposed on or over the active layer and the buffer layer, and including a second contact hole overlapping the first contact hole, a second conductive layer disposed on the first insulating film, and contacting a part of the first conductive layer and a part of the active layer through the first contact hole and the second contact hole, a second insulating film disposed on the second conductive layer, and including a third contact hole overlapping a part of each of the first contact hole and the second contact hole, and a third conductive layer disposed on the second insulating film, and contacting a part of the second conductive layer through the second contact hole. The third contact hole does not overlap the active layer.

In according to another aspect of the present disclosure, an organic light emitting display panel and an organic light emitting display device including the display panel, the display panel including: a substrate, a first conductive layer disposed on the substrate, a buffer layer disposed on the first conductive layer, and including a first contact hole overlapping a part of the first conductive layer, an active layer including an active pattern disposed on the buffer layer and a conductive pattern disposed on the active pattern, a first insulating film disposed on or over the active layer and the buffer layer, and including a second contact hole overlapping the first contact hole, a second conductive layer disposed on the first insulating film, and contacting a part of the first conductive layer and a part of the active layer through the first contact hole and the second contact hole, a plate disposed in the same layer as the second conductive layer, and spaced apart from the second conductive layer. The third contact hole does not overlap the active layer, and one or more of the first conductive layer, the active layer and the plate form a storage capacitor.

According to the present disclosure, as a plurality of contact holes disposed in an area in which a second node of a driving transistor is located are disposed to overlap, and thus, a size of a conductive layer overlapping the plurality of contact holes can be reduced, it is therefore possible to provide an organic light emitting display panel having high luminance characteristics and an organic light emitting display device including the display panel by enabling an area of a non-light emitting area to be reduced without reducing an area of a storage capacitor, and an area of a light emitting area to be increased relative to the reduction of the area of the non-light emitting area.

Further, according to the present disclosure, as a plurality of contact holes disposed in an area in which the second node of the driving transistor is located overlap, and thus, a size of a conductive layer overlapping the plurality of contact holes can be reduced, a size or capacity of a storage capacitor can be therefore increased without reducing an area of a light emitting area, and as a result, it is possible to provide an organic light emitting display panel having high luminance and high resolution and an organic light emitting display device including the display panel.

Further, according to the present disclosure, as an active layer includes an active pattern and a conductive pattern disposed on the active pattern, it is possible to provide an organic light emitting display panel in which sub-pixels can be easily driven and an organic light emitting display device including the display panel.

Further, according to the present disclosure, as the active layer does not overlap a part of an area in which a plurality of contact holes are formed, it is possible to provide an organic light emitting display panel having a structure capable of preventing an active layer or a buffer layer from being damaged in an associated process and an organic light emitting display device including the display panel.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
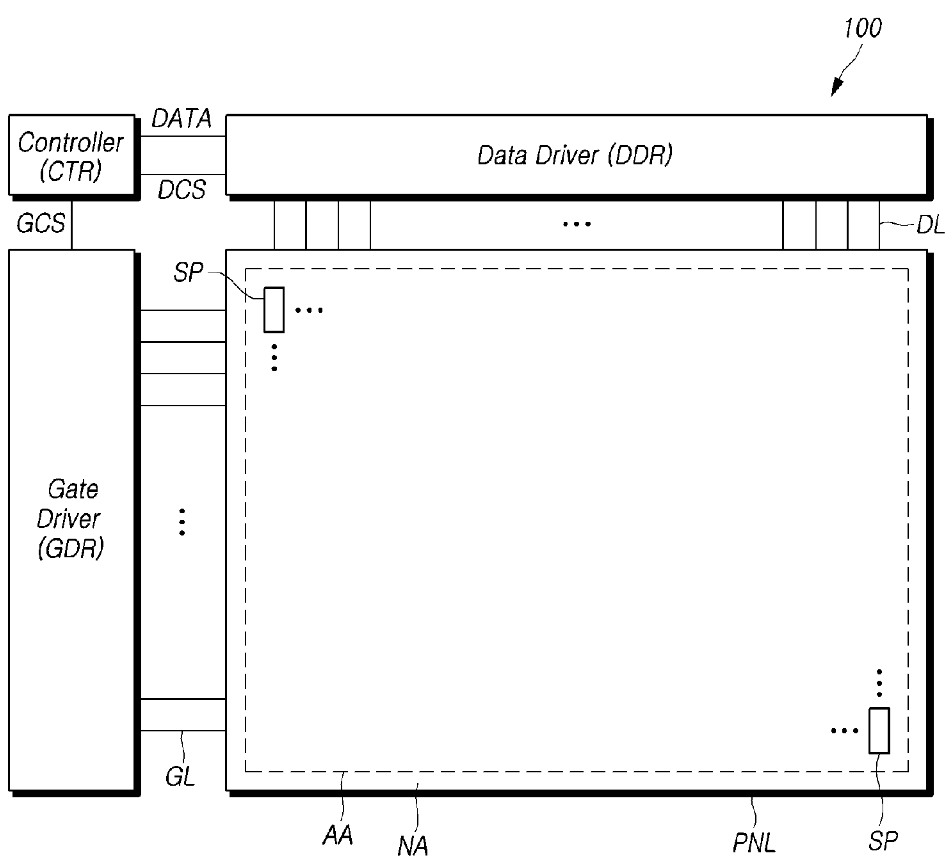
FIG. 1 schematically illustrates a system configuration of an organic light emitting display device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 schematically illustrates a system configuration of an organic light emitting display device according to aspects of the present disclosure.

Organic light emitting display devices according to aspects of the present disclosure may include an organic light emitting display device 100, a lighting device, a light emitting device, and the like. Hereinafter, for convenience of description, organic light emitting display devices according to aspects of the present disclosure will be described with respect to the organic light emitting display device 100. However, it should be appreciated that as long as a transistor is included, aspects described herein may be applicable to various organic light emitting display devices, such as the lighting device, the light emitting device, and the like, as well as the organic light-emitting display device 100.

The organic light emitting display device 100 according to aspects described herein includes an organic light emitting display panel PNL that displays an image or outputs light, and a driving circuit for driving the organic light emitting display panel PNL.

The organic light emitting display device 100 according to aspects described herein may be based on a bottom emission type in which light is emitted from an organic light emitting element toward a substrate over which the organic light emitting element is disposed; however, aspects of the present disclosure are not limited thereto. In some aspects, the organic light emitting display device 100 according to aspects described herein may be based on a top emission type in which light is emitted from an organic light emitting element toward a surface opposite to the substrate on which the organic light emitting element is disposed, or based on a double-side emission type in which light is emitted from the organic light emitting element toward both the substrate and the surface opposite to the substrate.

The organic light emitting display panel PNL may include a plurality of data lines DL and a plurality of gate lines GL, and a plurality of sub-pixels SP defined by the plurality of data lines DL and the plurality of gate lines GL, and arranged in a matrix pattern.

The plurality of data lines DL and the plurality of gate lines GL may be arranged to intersect each other in the organic light emitting display panel PNL. For example, the plurality of gate lines GL may be arranged in rows or columns, and the plurality of data lines DL may be arranged in columns or rows. Hereinafter, for convenience of description and ease of understanding, it is assumed that the plurality of gate lines GL is arranged in rows and the plurality of data lines DL is arranged in columns.

In addition to the plurality of data lines DL and the plurality of gate lines GL, one or more other types of signal lines may be arranged in the organic light emitting display panel PNL according to sub-pixel structures or the like. A driving voltage line, a reference voltage line, or a common voltage line may be further disposed.

Types of signal lines disposed on the organic light emitting display panel PNL may vary depending on sub-pixel structures or the like. Further, all or some of each type of signal lines described herein may include all or at least a part of an electrode to which a signal is applied.

The organic light emitting display panel PNL may include an active area A/A on which images are displayed, and a non-active area N/A that is an outer edge, on which images are not displayed. Here, the non-active area N/A is sometimes referred to as a bezel area.

A plurality of sub-pixels SP for image display is arranged in the active area A/A.

A pad portion including one or more conductive pads may be disposed in the non-active area N/A for an electrically connection with a data driver DDR, and a plurality of data link lines may be disposed in the non-active area N/A for electrically connecting between the pad portion and a plurality of data lines DL. Here, the plurality of data link lines may be parts of the plurality of data lines DL extending up to the non-active area N/A (e.g., from the active area A/A), or may be separate patterns electrically connected to the plurality of data lines DL.

Further, gate driving related lines may be arranged in the non-active area N/A to transmit a voltage (signal) required for gate driving to a gate driver GDR through a pad portion to which the data driver DDR is electrically connected. For example, gate driving related lines may include clock lines for carrying clock signals, gate voltage lines for transmitting gate voltages (VGH, VGL), and gate driving control signal lines for carrying various types of control signals required for generating scan signals. These gate driving related lines may be arranged the non-active area N/A, differently from the gate lines GL disposed in the active area A/A.

The driving circuit may include the data driver DDR driving a plurality of data lines DL, the gate driver GDR driving a plurality of gate lines GL, and a controller CTR for controlling the data driver DDR and the gate driver GDR.

The data driver DDR can drive the plurality of data lines DL by applying data voltages to the plurality of data lines DL.

The gate driver GDR can drive the plurality of gate lines GL by supplying scan signals to the plurality of gate lines GL.

The controller CT) can control driving operations of the data driver DDR and the gate driver GDR by supplying various types of control signals (DCS, GCS) required for the driving operations of the data driver DDR and the gate driver GDR. Further, the controller CTR can supply image data DATA to the data driver DDR.

The controller CTR starts to scan a pixel according to a timing processed in each frame, converts image data inputted from the outside (e.g., a host system, other devices or other image providing sources) to a data signal form adapted to be used in the data driver DDR and then outputs image data DATA resulted from the converting, and thus, enables the data to be written into the pixel at a pre-configured time according to the scanning.

To control the data driver DDR and the gate driver GDR, the controller CTR can receive, from the outside (e.g., the host system, other devices or other image providing sources), timing signals, such as, a vertical synchronization signal Vsync, a horizontal synchronization signal Hsync, an input data enable (Data Enable) signal, a clock signal, and the like. The controller CTR can generate various types of control signals using the received signals and supply such generated signals to the data driver DDR and the gate driver GDR.

For example, to control the gate driver GDR, the controller CTR can output several types of gate control signals GCS including a gate start pulse GSP, a gate shift clock GSC, a gate output enable signal GOE, and the like.

Further, to control the data driver DDR, the controller CTR can output several types of data control signals DCS including a source start pulse SSP, a source sampling clock SSC, a source output enable signal SOE, and the like.

The controller CTR may be a timing controller used in the typical display technology or a control apparatus/device capable of additionally performing other control functionalities in addition to the typical function of the timing controller.

The controller CTR may be implemented as a separate component from the data driver DDR or may be implemented as an integrated circuit in which the data driver DDR is integrated together.

The data driver DDR can drive a plurality of data lines DL by supplying data voltages to the plurality of data lines DL after having received image data DATA from the controller CTR. Here, the data driver DDR is sometimes referred to as a source driving circuit or a source driver.

The data driver DDR can transmit various signals to, or receive various signals from, the controller CTR through various interfaces.

The gate driver GDR can sequentially drive a plurality of gate lines GL by sequentially supplying scan signals to the plurality of gate lines GL. Here, the gate driver GDR is sometimes referred to as a scan driving circuit or a scan driver.

According to the control of the controller CTR, the gate driver GDR can sequentially supply scan signals representing an on-voltage or an off-voltage to the plurality of gate lines GL.

When a specific gate line is asserted by a scan signal from the gate driver GDR, the data driver DDR can convert image data DATA received from the controller CTR into analog data voltages and supply the obtained data voltages to the plurality of data lines DL.

The data driver DDR may be located on, but not limited to, only one side (e.g., an upper side or a lower side) of the display panel PNL, or in some aspects, be located on, but not limited to, two sides (e.g., the upper side and the lower side)

of the display panel PNL according to driving schemes, design schemes of display panels, or the like.

The gate driver GDR may be located on, but not limited to, only one side (e.g., a left side or a right side) of the display panel PNL, or in some aspects, be located on, but not limited to, two sides (e.g., the left side and the right side) of the display panel PNL according to driving schemes, design schemes of display panels, or the like.

The data driver DDR may be implemented by including one or more source driver integrated circuits SDIC.

Each source driver integrated circuit SDIC may include a shift register, a latch circuit, a digital-to-analog converter DAC, an output buffer, and the like. In some aspects, the data driver DDR may further include one or more analog-to-digital converters ADC.

Each source driver integrated circuit SDIC may be connected to a conductive pad such as a bonding pad of the organic light emitting display panel PNL in a tape automated bonding (TAB) type or a chip on glass (COG) type, or be directly disposed on the display panel 110. In some aspects, each source driver integrated circuit SDIC may be integrated into the organic light emitting display panel PNL. In some aspects, each source driver integrated circuit SDIC may be implemented in a chip on film (COF) type. In this instance, each source driver integrated circuit SDIC may be mounted on a circuit film, and electrically connected to data lines DL in the organic light emitting display panel PNL through the circuit film.

The gate driver GDR may include a plurality of gate driving circuits GDC. The plurality of gate driving circuits GDC may correspond to a plurality of gate lines GL, respectively.

Each gate driving circuit GDC may include a shift register, a level shifter, and the like.

Each gate driving circuit GDC may be connected to a conductive pad such as a bonding pad of the organic light emitting display panel PNL in the tape automated bonding (TAB) type or the chip on glass (COG) type. In some aspects, each gate driving circuit GDC may be implemented in the chip on film (COF) type. In this instance, each gate driving circuit GDC may be mounted on a circuit film, and electrically connected to gate lines GL in the organic light emitting display panel PNL through the circuit film. Further, each gate driving circuit GDC may be implemented in a gate in panel (GIP) type and may be embedded in the organic light emitting display panel PNL. That is, each gate driving circuit GDC may be directly formed in the organic light emitting display panel PNL.

Figure 2:
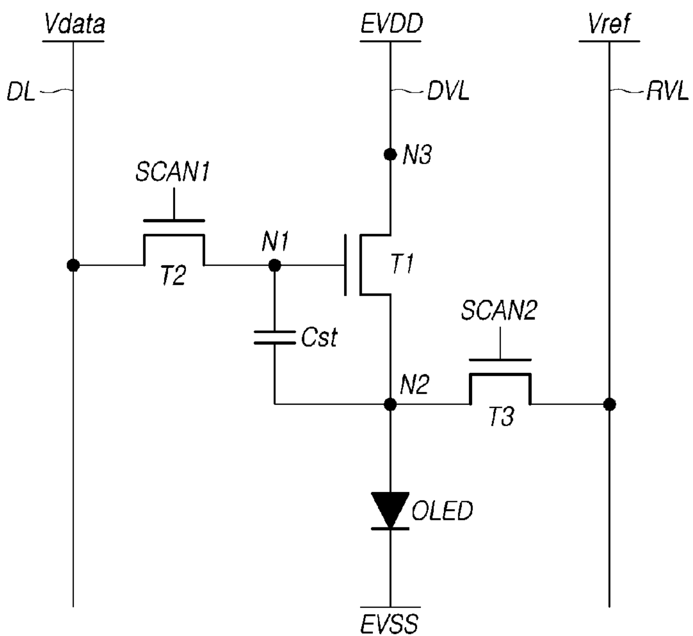
FIG. 2 illustrates a sub-pixel structure when an organic light emitting display panel including organic light emitting diodes (OLED) is employed in the display device according to aspects of the present disclosure.

FIG. 2 illustrates a sub-pixel SP structure when an organic light emitting display panel PNL including an organic light emitting element such as an organic light emitting diodes (OLED) is employed in the display device according to aspects of the present disclosure.

Referring to FIG. 2, each sub-pixel SP in the organic light emitting display panel PNL including the organic light emitting element may include a second transistor T2 passing a data voltage Vdata to a first node N1 corresponding to a gate node of a driving transistor T1, and a storage capacitor Cst for maintaining the data voltage Vdata corresponding to an image signal voltage or a voltage corresponding to this during one frame time.

The organic light emitting element OLED may include a first electrode (an anode electrode or a cathode electrode), an organic layer including at least one emission layer, and a second electrode (the cathode electrode or the anode electrode).

In one aspect, a base voltage EVSS such as a low-level voltage may be applied to the second electrode of the organic light emitting element OLED.

The driving transistor T1 can drive the organic light emitting diode OLED by supplying a driving current to the organic light emitting diode OLED.

The driving transistor T1 may have the first node N1, a second node N2, and a third node N3.

The "node" of the first to third nodes N1, N2, and N3 may denote a point, one or more electrodes, or one or more lines, which have an equal electrical state.

Each of the first node N1, the second node N2, and the third node N3 may be made up of one or more electrodes.

The first node N1 of the driving transistor T1 may be a node corresponding to the gate node thereof, and may be electrically connected to a source node or a drain node of the second transistor T2.

The second node N2 of the driving transistor T1 may be electrically connected to the first electrode 301 of the organic light emitting element OLED and may be a source node or a drain node.

The third node N3 of the driving transistor T1 may be the drain node or the source node as a node to which a driving voltage EVDD is applied, and may be electrically connected to a driving voltage line DVL for passing the driving voltage EVDD.

The driving transistor T1 and the second transistor T2 may be n-type transistors or p-type transistors.

The second transistor T2 may be electrically connected between a data line DL and the first node N1 of the driving transistor T1 and may be controlled by a scan signal SCAN that is delivered through a gate line and applied to the gate node of the first transistor T1.

The second transistor T2 may be turned on by the scan signal SCAN and apply a data voltage Vdata passed through the data line DL to the first node N1 of the driving transistor T1.

The storage capacitor Cst may be electrically connected between the first node N1 and the second node N2 of the driving transistor T1.

The storage capacitor Cst is an external capacitor intentionally designed to be located outside of the driving transistor T1, other than an internal storage, such as a parasitic capacitor (e.g., a Cgs, a Cgd) that presents between the first node N1 and the second node N2 of the driving transistor T1.

A third transistor T3 may be electrically connected between the second node N2 of the driving transistor T1 and a reference voltage line RVL. On-off operations of the third transistor T3 can be controlled by a second scan signal SCAN2 applied to the gate node of the second transistor T3.

A drain node or a source node of the third transistor T3 may be electrically connected to the reference voltage line RVL, and the source node or the drain node of the third transistor T3 may be electrically connected to the source node of the driving transistor T1.

The third transistor T3, for example, may be turned on in a period in which display driving is performed, and turned on in a period in which sensing driving is performed for sensing a characteristic value of the driving transistor T1 or a characteristic value of the organic light emitting diode (OLED).

The third transistor T3 may be turned on by the second scan signal SCAN2 and pass a reference voltage Vref applied to the reference voltage line RVL to the second node N2 of the driving transistor T1, according to corresponding driving timings (e.g., a display driving timing or an initial timing within a time period for the sensing driving).

The third transistor T3 may be turned on by the second scan signal SCAN2 and pass a voltage at the second node N2 of the driving transistor T1 to the reference voltage line RVL, according to corresponding driving timings (e.g., a sampling timing within the time period for the sensing driving).

In other words, the third transistor T3 can control a voltage status at the second node N2 of the driving transistor T1, or pass the voltage at the second node N2 of the driving transistor T1 to the reference voltage line RVL.

The reference voltage line RVL may be electrically connected to an analog-to-digital converter that senses a voltage of the reference voltage line RVL, converts the sensed voltage to a digital value, and then, outputs sensing data including the digital value.

The analog-to-digital converter may be included in the source driver integrated circuit SDIC implementing the data driving circuit DDR.

The sensing data output from the analog-to-digital converter may be used to sense a characteristic value of the driving transistor T1 (e.g., a threshold voltage, mobility, etc.) or a characteristic value of the organic light emitting diode (OLED) (e.g., a threshold voltage, etc.).

Each of the driving transistor T1, the second transistor T2, and the third transistor T3 may be an n-type transistor or a p-type transistor.

Meanwhile, the first scan signal SCAN1 and the second scan signal SCAN2 may be separate gate signals. In this instance, the first scan signal SCAN1 and the second scan signal SCAN2 respectively may be applied to the gate node of the second transistor T2 and the gate node of the third transistor T3 through different gate lines.

In some aspect, the first scan signal SCAN1 and the second scan signal SCAN2 may be the same gate signal. In this instance, the first scan signal SCAN1 and the second scan signal SCAN2 may be commonly applied to the gate node of the second transistor T2 and the gate node of the third transistor T3 through the same gate line.

Figure 3:
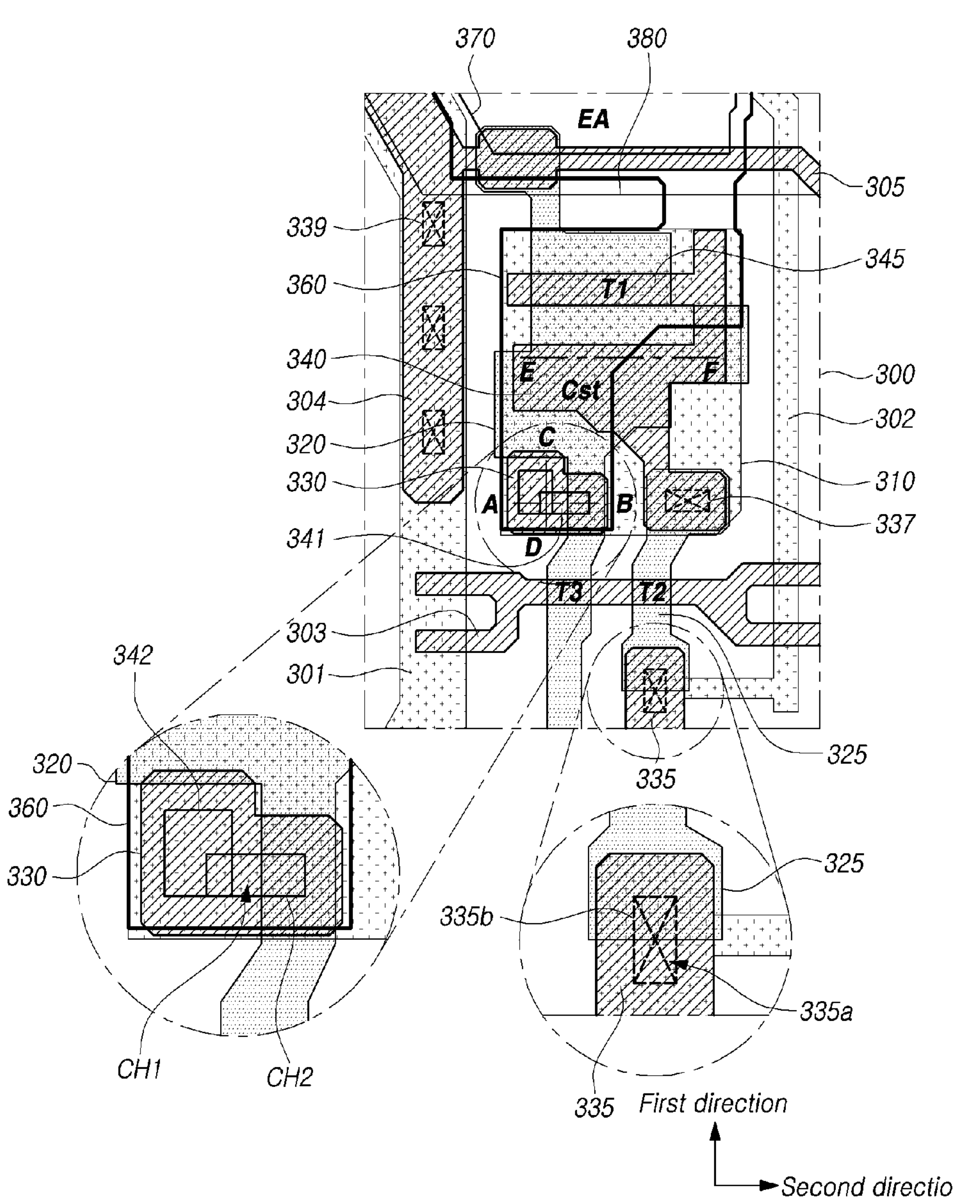
FIG. 3 is a plan view illustrating a partial area of a sub-pixel disposed in an active area of the organic light emitting display device according to aspects of the present disclosure.

It should be understood that the sub-pixel structure with three transistors (3T) and one capacitor (1C) shown in FIG. 3 is merely one example of possible sub-pixel structures for convenience of discussion, and aspects of the present disclosure may be implemented in any of various structures, as desired. For example, the sub-pixel may further include at least one transistor and/or at least one capacitor.

In some aspects, each of a plurality of sub-pixels may have the same structure, or some of the plurality of sub-pixels may have a different structure.

FIG. 3 is a plan view illustrating a partial area of a sub-pixel disposed in an active area of the organic light emitting display device according to aspects of the present disclosure.

Referring to FIG. 3, at least one sub-pixel of the organic light emitting display device 100 according to aspects of the present disclosure may include a light emitting area EA and a non-light emitting area defined by a bank 370.

The light emitting area EA may be an area not overlapping the bank 370, and the non-light emitting area EA may be an area overlapping the bank 370.

An organic light emitting element OLED, such as an organic light emitting diode, including a first electrode, an organic layer, and a second electrode may be disposed in the light emitting area EA. Further, a color filter 380 may be disposed on the organic light emitting element OLED; however, aspects of the present disclosure are not limited thereto. For example, a color filter 380 may be disposed only in some of a plurality of sub-pixels included in the organic light emitting display device 100, or the color filter may not be applied to all of the sub-pixel included in the organic light emitting display device 100.

As shown in FIG. 3, the color filter 380 may be disposed to overlap all of the light emitting area EA and a part of the non-light emitting area.

The non-light emitting area may include a first conductive layer 310, a first active layer 320, a second conductive layer 330, and a plate 340 disposed on or over the substrate 300.

Further, the non-light emitting area may further include a second active layer 325 that is disposed in the same layer as the first active layer 320, and a third conductive layer 360 that is an anode electrode (or cathode electrode) of the organic light emitting element that is disposed on or over the second conductive layer 330 and the plate 340.

Specifically, a first conductive layer 310 may be disposed on the substrate 300.

Further, a first signal line 301 and a second signal line 302 may be disposed in the same layer as the first conductive layer 310 and running in a first direction on or over the substrate 300. The first signal line 301 may be a driving voltage line (DVL in FIG. 2), and the second signal line 302 may be a data line (DL in FIGS. 1 and 2); however, aspects of the present disclosure are not limited thereto. For example, each of the first and second signal lines 301 and 302 may be a data line.

For convenience of explanation, hereinafter, discussions are conducted by focusing on a structure in which the first signal line 301 is a driving voltage line and the second signal line 302 is a data line.

The first active layer 320 may be disposed on or over the first conductive layer 310.

Here, a part of the first active layer 320 may overlap a part of the first conductive layer 310.

Further, the second active layer 325 that is disposed in the same layer as the first active layer 320 and spaced apart from the first active layer 320 may be disposed on or over the substrate 300.

The second conductive layer 330, a fourth conductive layer 335, the plate 340, a third signal line 303, and a fourth signal line 304 may be arranged over the substrate 300 over which the first and second active layers 320 and 325 are disposed.

Each of the second conductive layer 330, the fourth conductive layer 335, the plate 340, and the third signal line 303 may be disposed to be spaced apart from one another.

A part of the second conductive layer 330 may overlap a part of the first active layer 320.

A part of the fourth conductive layer 335 may overlap a part of the second active layer 325.

A part of the plate 340 may overlap a part of the first active layer 320 and a part of the second active layer 325.

A part of the third signal line 303 may overlap a part of the first active layer 320 and a part of the second active layer 325.

The fourth signal line 304 may overlap a part of the first signal line 301.

Although not shown in FIG. 3, a buffer layer may be disposed between the first conductive layer 310 and the first active layer 320, and a first insulating film may be disposed between the first active layer 320 and the second conductive layer 330.

The buffer layer may overlap the first conductive layer 310 and the second conductive layer 330, and include a first contact hole CH1 in an area in which the second conductive layer 330 does not overlap the first active layer 320. Further, the first insulating film may include a second contact hole CH2 overlapping the first contact hole CH1 and overlapping an area in which the second conductive layer 330 overlaps the first active layer 320.

That is, the first contact hole CH1 may not overlap the first active layer 320.

A part of the top surface of the first conductive layer 310 may be exposed through the first contact hole CH1 and the second contact hole CH2, and a part of the top surface of the first active layer 320 may be exposed through the second contact hole CH2.

The second conductive layer 330 may contact a part of the top surface of the first conductive layer 310 through the first contact hole CH1 and the second contact hole CH2. In addition, the second conductive layer 330 may contact a part of the top surface of the first active layer 320 through the second contact hole CH2.

In a plan view, an area of the first contact hole CH1 may be smaller than an area of the second contact hole CH2.

Although not shown in FIG. 3, the first active layer 320 may be electrically connected to the reference voltage line shown in FIG. 2.

In other words, an area in which the second conductive layer 330 contacts the first conductive layer 310 and an area in which the second conductive layer 330 contacts the first active layer 320 may be included in an area corresponding to the second node N2 of the driving transistor T1 of FIG. 2.

The fourth conductive layer 335 may be electrically connected, by contacting each other, to the data line 302 through a contact hole 335*a* formed in the buffer layer, and electrically connected, by contacting each other, to a second active layer 325 through a contact hole 335*b* formed in the first insulating film.

Here, the contact hole 335*a* formed in the buffer layer and the contact hole 335*b* formed in the first insulating film may overlap, and an area of the contact hole 335*a* formed in the buffer layer may be smaller than the contact hole 335*b* formed in the insulating film in a plane view. The contact hole 335*a* formed in the buffer layer may not overlap the second active layer 325.

A part of the plate 340 may overlap a part of the first active layer 320 and a part of the first conductive layer 310.

Each of the first conductive layer 310, the first active layer 320, and the plate 340 may serve as an electrode of the storage capacitor Cst. A part of the first active layer 320 overlapping the plate 340 and the first conductive layer 320 may be a conductive area or an area in which a conductive pattern is disposed.

A part of the plate 340 may be electrically connected, by contacting each other, to a part of the second active layer 325 through a contact hole 337 formed in the buffer layer.

An area in which the plate 340 contacts the part of the second active layer 325 through the contact hole 337 may be included in an area corresponding to the first node N1 of the driving transistor T1 of FIG. 2.

The plate 340 may include at least one first extension portion 345 protruding from one side of the plate 340.

A part of the first extension part 345 may overlap a part of the first active layer 320. The first extension part 345 may serve as the gate electrode of the driving transistor T1 shown in FIG. 2. The first active layer 320 may serve as an active layer of the driving transistor T1.

The third signal line 303 may be disposed on or over the first signal line 301 and the second signal line 302, and may extend in a second direction that is a direction intersecting a first direction that is a direction in which the first signal line 301 and the second signal line 302 extend.

The third signal line 303 may overlap a part of the first signal line 301 and may also overlap a part of the second signal line 302. Further, as described above, the third signal line 303 may also overlap a part of the first active layer 320 and a part of the second active layer 325.

An area in which the third signal line 303 overlaps the first active layer 320 may be an area corresponding to the third transistor T3 of FIG. 2. The area in which the third signal line 303 overlaps the second active layer 325 may be an area corresponding to the second transistor T2 of FIG. 2.

The fourth signal line 304 may be disposed to overlap a part of the first signal line 301. Further, the fourth signal line 304 and the first signal line 301 may be electrically connected through a plurality of contact holes 339 formed in the buffer layer and the insulating film. Through this, the resistance of signal lines can be reduced.

Further, the fourth signal line 304 may include a second extension portion 305 extending from the fourth signal line 304. Sub-pixels may receive driving voltages through the second extension portion 305; however, aspects of the present disclosure are not limited thereto. For example, when the first signal line 301 is a data line, the fourth signal line 304 may not be disposed on the first signal line 301.

The third conductive layer 360 may be disposed on or over the substrate 300 on or over which the second conductive layer 330, the fourth conductive layer 335, the plate 340, the third signal line 303, and the fourth signal line 304 are disposed.

The third conductive layer 360 may be an anode electrode or a cathode electrode of an organic light emitting element.

The third conductive layer 360 may contact a part of the top surface of the second conductive layer 330 through a contact hole 342 formed in at least one insulating film disposed between the second conductive layer 330 and the third conductive layer 360. Thus, the third conductive layer 360 may be electrically connected to the second conductive layer 330.

As described above, the third conductive layer 360 may be electrically connected to the second conductive layer 330, and the second conductive layer 330 may be electrically connected to the first active layer 320 and the first conductive layer 310. Here, an area in which the first conductive layer 310, the first active layer 320, and the second conductive layer 330 contact, and an area in which the second conductive layer 330 and the third conductive layer 360 contact may be an area corresponding to the second node N2 of FIG. 2.

The first contact hole CH1 for electrically connecting the first conductive layer 310 and the second conductive layer 330, the second contact hole CH2 for electrically connecting the first active layer 320 and the second conductive layer 330, and the contact holes 342 for electrically connecting the second conductive layer 330 and the third conductive layer 360 may overlap one another.

Specifically, the entire first contact hole CH1 may overlap a part of the second contact hole CH2. A width of the first contact hole CH1 in the second direction (the direction in which the third signal line extends) may be smaller than a width of the second contact hole CH2 in the second direction.

In addition, a part of the first contact hole CH1 and a part of the second contact hole CH1 may overlap a part of the contact hole 342 of at least one insulating film disposed between the second conductive layer 330 and the third conductive layer 360.

When the first contact hole CH1, the second contact hole CH2, and the contact hole 342 are spaced apart from one another, the non-light emitting area of the sub-pixel is required to include an area occupied by the first contact hole CH1 and an area occupied by the second contact hole CH2, and an area occupied by the contact hole 342.

In contrast, in the organic light emitting display device 100 according to aspects described herein, as the entire first contact hole CH1 overlaps the second contact hole CH2, and a part of the first contact holes CH1 and a part of the second contact hole CH2 overlap a part of the contact hole 342 of at least one insulating film disposed between the second conductive layer 330 and the third conductive layer 360, it is possible to reduce an area occupied by a point corresponding to the second node N2 of the driving transistor T1 of FIG. 2.

In this manner, as the area of the point corresponding to the second node N2 of the driving transistor T1 is reduced, even without reducing an area of a light emitting area EA of the organic light emitting display device 100, an area of the storage capacitor Cst can be increased, or an area occupied by a non-light emitting area can be reduced. Thereby, it is possible to increase an area of the light emitting area EA.

The above description will be discussed in detail with reference to FIG. 4.

Figure 4:
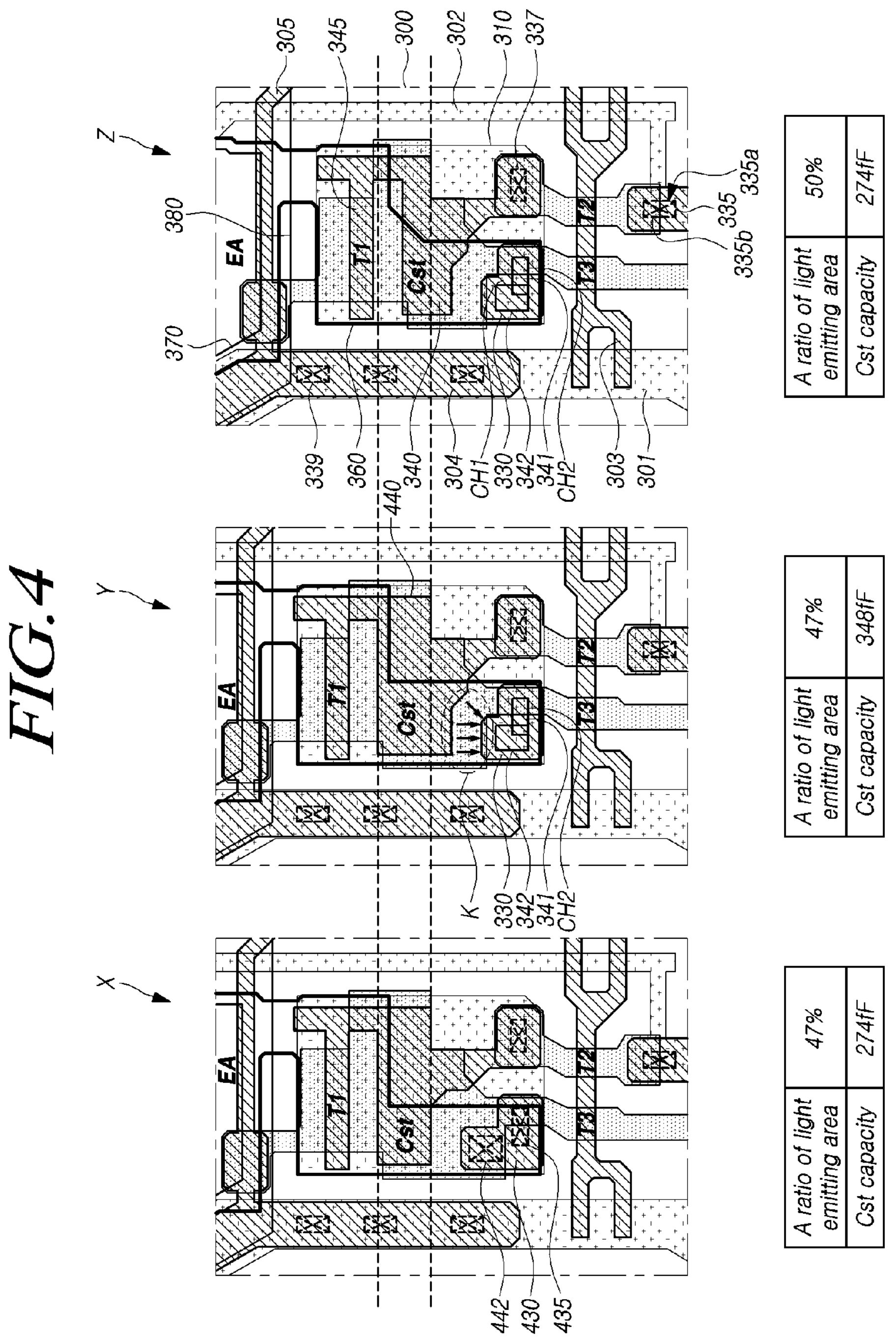
FIG. 4 illustrates a change in an area of a storage capacitor or a ratio of a light emitting area in a sub-pixel in the organic light emitting display device according to aspects of the present disclosure.

FIG. 4 illustrates a change in an area of a storage capacitor or a ratio of a light emitting area in a sub-pixel in the organic light emitting display device according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

Referring to sub-pixels Y and Z of FIG. 4, as described with reference to FIG. 3, by having a structure in which the entire first contact hole CH1 located in an area corresponding to the second node N2 of the driving transistor T1 overlaps the second contact hole CH2, and a part of the first contact hole CH1 and a part of the second contact hole CH2 overlap a part of the contact hole 342 of the at least one insulating film disposed between the second conductive layer 330 and the third conductive layer 360, a size of an area corresponding to the second node N2 of the driving transistor T1 can be reduced compared to a structure in which the contact holes CH1, CH2, and 342 do not overlap.

Further, as the area occupied by the contact holes CH1, CH2, and 342 in the non-light emitting area decreases, the area of the second conductive layer 330 overlap the contact holes CH1, CH2 and 342 can also be reduced.

In contrast, referring to the X sub-pixel of FIG. 4, when first and second contact holes 435 and a contact hole 442 of at least one insulating film disposed between the second conductive layer 330 and the third conductive layer 360 do not overlap, areas occupied by respective contact holes 435 and 442 can be increased, and thus, an area of a second conductive layer 430 disposed to overlap the contact holes 435 and 442 can be increased.

Meanwhile, as the second conductive layers 330 and 430 are disposed in the same layer as the plate 340 serving as an electrode of the storage capacitor Cst, the second conductive layers 330 and 430 and the plate 340 are required to be spaced apart from each other in order to prevent a short circuit between the second conductive layers 330 and 430 and the plate 340.

Accordingly, as shown in the sub-pixel X of FIG. 4, when the area of the second conductive layer 430 is increased, it is difficult to increase the area of plate 340 adjacent to the second conductive layer 430.

In contrast, as shown in the Y sub-pixel of FIG. 4, a size of the second conductive layer 330 overlapping the contact holes (CH1, CH2, and 342) can be reduced by having a structure in which the entire first contact hole CH1 overlaps the second contact hole CH2, and a part of the first contact hole CH1 and a part of the second contact hole CH2 overlap a part of the contact hole 342 of at least one insulating film disposed between the second conductive layer 330 and the third conductive layer 360.

When the size of the second conductive layer 330 is reduced, a distance between the second conductive layer 330 and the plate 440 may also increase. In this situation, even when the area of the plate 440 is increased as shown in FIG. 4, as it may be separated from the second conductive layer 330, it is possible to implement the organic light emitting display device 100 including a high-capacity storage capacitor.

Further, as shown in the Y sub-pixel of FIG. 4, the capacity of the storage capacitor Cst can be increased as an extension portion (area K) of the plate 340 overlaps the first active layer 320 and the first conductive layer 310 which are the other electrode of the storage capacitor Cst.

In particular, in a situation where the organic light emitting display device 100 has high resolution, a high-capacity storage capacitor (Cst) is required, and to implement such a high-capacity storage capacitor (Cst), it is required to increase an area of the storage capacitor (Cst) disposed in the subpixel.

An area of each sub-pixel is limited, and if the area of one or more electrodes of the storage capacitor (Cst) disposed in a non-light emitting area is increased, an area of a light-emitting area included in the sub-pixel may be decreased. This can lead the luminance of the sub-pixel to reduce, and after-images to occur when the associated panel is driven.

In contrast, as shown in the Y sub-pixel of FIG. 4, as the entire first contact hole CH1 disposed in the non-light emitting area overlaps a part of the second contact hole CH2, and a part of the first contact hole CH1 and a part of the second contact hole CH2 overlap a part of the contact hole 342 of at least one insulating film disposed between the second conductive layer 330 and the third conductive layer 360, respective areas occupied by the contact holes (CH1, CH2, and 342) can be reduced, and thus, the area of the second conductive layer 330 overlapping the contact holes (CH1, CH2, and 342) can be reduced.

Accordingly, an area of at least one electrode of the storage capacitor Cst (e.g., the area of the plate that is the electrode of the storage capacitor) can be increased relative to the area occupied by the second node N2 of the driving transistor T1 is reduced. In other words, as the area of the electrode of the storage capacitor Cst can be increased without reducing the area of the light emitting area, it is possible to implement the organic light emitting display device 100 having high luminance and high resolution characteristics and preventing after-images.

Accordingly, when comparing the X sub-pixel and the Y sub-pixel, it can be seen that the capacity of the storage capacitor Cst increases from 247 fF to 348 fF as an area of a plate increases (i.e. when the plate 440 is used rather than the plate 340). Further, it can be seen that even when the area of the storage capacitor Cst corresponding to the plate 340 or 440 disposed in the non-light emitting areas is increased, there is no change in a ratio of an area occupied by a light emitting area EA in the sub-pixel.

As described above, the capacity of the storage capacitor Cst can be increased by increasing the area of the plate 340 disposed in the non-light emitting area of the organic light emitting display device 100 according to aspects described herein, and, in another aspect, as shown in the Z sub-pixel, instead of increasing the area of the plate 340, the area of the light emitting area EA can be increased relative to the reduction of the area occupied by the second node N2 of the driving transistor T1.

In particular, when the organic light emitting display device 100 is required to provide high luminance, the area of the light emitting area EA is required to be increased.

Referring to the structure of the Z sub-pixel of FIG. 4, as the size of the second conductive layer 330 is reduced, a location of the plate 340 may be arranged to be father away from the light emitting area while maintaining a distance between the plate 340 and the second conductive layer 330 and the capacity of the storage capacitor Cst. As a consequence, as the area of the non-light emitting area can be reduced, by designing the light emitting area to have an increased area relative to the reduction of the area of the non-light emitting area, it is possible to implement the organic light emitting display device 100 having high luminance.

Accordingly, when comparing the X sub-pixel and the Z sub-pixel, it can be seen that, as the plate 340 moves away from the light emitting area EA, a ratio of an area occupied by the light emitting area EA in the sub-pixel increases from 47% to 50% without a change in the capacity of the storage capacitor Cst.

Detailed structures for the area, as described above, included in the second node N2 of the driving transistor T1 of the organic light emitting display device 100 capable of realizing high luminance and high resolution according to aspects described herein are as follows.

Figure 5:
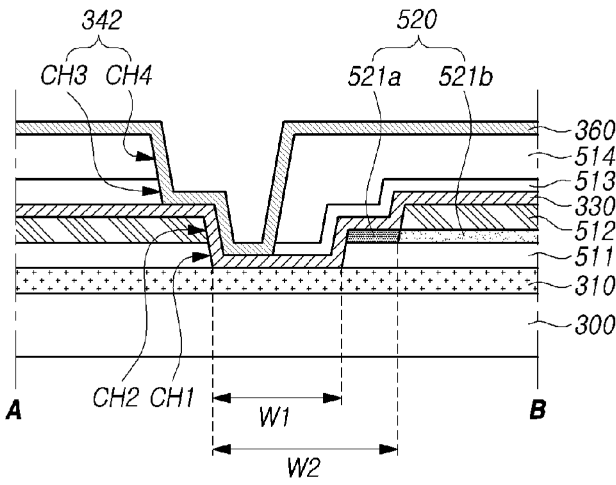
FIG. 5 is a cross-sectional view taken along with line A-B of FIG. 3 in one aspect according to aspects of the present disclosure.

FIG. 5 is a cross-sectional view taken along with line A-B of FIG. 3 in one aspect according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

Referring to FIG. 5, the first conductive layer 310 may be disposed on the substrate 300.

The first conductive layer 310 may include a conductive material capable of absorbing or reflecting light. For example, the first conductive layer 310 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, aspects of the present disclosure are not limited thereto.

The first conductive layer 310 may be disposed under the first active layer 520, and serve to protect the first active layer 520 from external factors (e.g., light) or serve as an electrode of the storage capacitor Cst.

In FIG. 5, the first conductive layer 310 is represented as a single layer structure; however, aspects of the present disclosure are not limited thereto. For example, the first conductive layer 310 may have a multilayer structure.

The buffer layer 511 may be disposed over the substrate on which the first conductive layer 310 is disposed.

The buffer layer 511 may include an inorganic insulating material such as silicon oxide (SiOx), silicon nitride (SiNx), or silicon oxynitride (SiON); however, aspects of the present disclosure are not limited thereto.

In FIG. 5, the buffer layer 310 is represented as a single layer structure; however, aspects of the present disclosure are not limited thereto. For example, the buffer layer 511 may have a multilayer structure.

The buffer layer 511 may include the first contact hole CH1 exposing a part of the top surface of the first conductive layer 310.

The first active layer 520 may be disposed on a part of the top surface of the buffer layer 511.

As illustrated in FIG. 5, the first active layer 520 disposed on a sub-pixel of the organic light emitting display device 100 according to aspects described herein may have a single layer.

The first active layer 520 may be various types of semiconductor layers.

The first active layer 520 may be formed of an oxide semiconductor. An material included in the first active layer 320 may be a metal oxide semiconductor, and may be formed of i) an oxide of a metal such as molybdenum (Mo), zinc (Zn), indium (In), gallium (Ga), tin (Sn), titanium (Ti), or the like, or ii) an combination of a metal such as molybdenum (Mo), zinc (Zn), indium (In), gallium (Ga), tin (Sn), titanium (Ti), or the like and an oxide of molybdenum (Mo), zinc (Zn), indium (In), gallium (Ga), tin (Sn), titanium (Ti), or the like.

For example, the first active layer 520 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO); however, aspects of the present disclosure are not limited thereto.

The first active layer 520 may include a conductive area and a non-conductive area. Further, the first insulating film 512 may be disposed on the non-conductive area of the first active layer 520, and the conductive area of the first active layer 520 may be an area not overlapping the first insulating film 512.

The first insulating film 512 may be disposed on the first active layer 520.

The first insulating film 512 may include an inorganic insulating material such as silicon oxide (SiOx), silicon nitride (SiNx), or silicon oxynitride (SiON); however, aspects of the present disclosure are not limited thereto.

The first insulating film 512 may include the second contact hole CH2 overlapping the first contact hole CH1 provided in the buffer layer 511.

Accordingly, the first insulating film 512 may also expose a part of the top surface of the first conductive layer 310 through the second contact hole CH2. Further, the second contact hole CH2 of the first insulating film 512 may expose a part of the top surface of the first active layer 520.

The entire first contact hole CH1 of the buffer layer 511 may overlap a part of the second contact hole CH2 of the first insulating film 512. The first contact hole CH1 of the buffer layer 511 may not overlap the first active layer 520.

The first contact hole CH1 of the buffer layer 511 and the second contact hole CH2 of the first insulating film 512 may be formed through the same process. Through this, it is possible to reduce the number of masks required to form the buffer layer 511 and the first insulating film 512.

Specifically, a material of the buffer layer 511 may be deposited on the substrate 300, and a material of the first active layer 520 may be deposited on the buffer layer 511.

After patterning the material of the first active layer 520, a material of the first insulating film 512 may be deposited over the substrate 300.

Thereafter, a process of forming a contact hole in each of the first insulating film 512 and the buffer layer 511 may be performed through a dry etching process. In this situation, in an area which the material of the first active layer 520 on the buffer layer 511 is present, as the material of the first active layer 520 serves as a mask, as a result, the contact hole of the buffer layer 511 may not be formed in the corresponding area.

That is, as shown in FIG. 5, even when the respective contact holes are formed in the first insulating film 512 and the buffer layer 511 through the same process, since the first contact of the buffer layer 511 is not formed in the area where the first active layer 520 is present, and the material of the first active layer 520 serving as a mask is not present on the insulating film 512, a width W1 of the first contact hole CH1 of the buffer layer 511 may be smaller than a width W1 of the second contact hole CH2 of the first insulating film 512. Here, each of the width W1 of the first contact hole CH1 of the buffer layer 511 and the width W2 of the second contact hole CH2 of the first insulating film 512 may be a minimum length in the second direction (the direction in which the third signal line extends in FIG. 3).

The first insulating film 512 may expose a part of the top surface of the first active layer 520 disposed on the buffer layer 511 through the second contact hole CH2. An area of the first active layer 520 not overlapping the first insulating film 512 may be a conductive area 521*a*.

As described above, the material of the first insulating film 512 may be patterned through the dry etching process using plasma to form the first insulating film 512 having the second contact hole CH2. Further, the first active layer 520 disposed in an area corresponding to an area in which the material of the first insulating film 512 is removed through dry etching may become conductive due to plasma.

Further, an area of the first active layer 520 overlapping the first insulating film 512 may be a non-conductive area 521*b*.

FIG. 5 illustrates a structure in which the conductive area 521*a* of the first active layer 520 is an area that does not overlap the first insulating film 512, and the non-conductive area 521*b* of the first active layer 520 is an area overlapping the first insulating film 512; however, aspects of the present disclosure are not limited thereto. Herein, depending on process conditions of dry etching, there may be provided a structure in which a part of the conductive area 521*a* of the first active layer 520 overlaps the first insulating film 512.

The second conductive layer 330 may be disposed over the substrate 300 over which the first insulating film 512 is disposed.

The second conductive layer 330 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, aspects of the present disclosure are not limited thereto.

The second conductive layer 330 may contact the top surface of the first conductive layer 310 exposed through the first contact hole CH1 of the buffer layer 511 and the second contact hole CH2 of the first insulating film 512.

Further, the second conductive layer 330 may be disposed over the buffer layer 511 and contact the conductive area 521*a* of the first active layer 520 disposed around the first contact hole CH1 of the buffer layer 511.

In other words, the second conductive layer 330 may be electrically connected to the first conductive layer 310 and may be electrically connected to the first active layer 520 as well.

The second insulating film 513 may be disposed on the second conductive layer 330.

The second insulating film 513 may include an inorganic insulating material such as silicon oxide (SiOx), silicon nitride (SiNx), or silicon oxynitride (SiON); however, aspects of the present disclosure are not limited thereto.

The second insulating film 513 may include a third contact hole CH3 exposing a part of the top surface of the second conductive layer 330. The third contact hole CH3 of the second insulating film 513 may overlap a part of the first contact hole CH1 formed in the buffer layer 511, and overlap a part of the second contact hole CH2 formed in the first insulating film 512.

Thereby, a part of the second conductive layer 330 contacting the first conductive layer 310 and at least one part of the second conductive layer 330 disposed on the buffer layer 511 and the first insulating film 512 may overlap the third contact hole CH3 of the second insulating film 513.

A third insulating film 514 may be disposed on the second insulating film 513.

The third insulating film 514 may include an organic insulating material; however, aspects of the present disclosure are not limited thereto.

The third insulating film 514 may include a fourth contact hole CH4 overlapping the third contact hole CH3 of the second insulating film 513. The third insulating film 514 may expose a part of the top surface of the second conductive layer 330 through the fourth contact hole CH4.

An area of the third contact hole CH3 of the second insulating film 513 and an area of the fourth contact hole CH4 of the third insulating film 514 may have the same size; however, aspects of the present disclosure are not limited thereto. For example, the area of the third contact hole CH3 of the second insulating film 513 may be smaller than the area of the fourth contact hole CH4 of the third insulating film 514. In this instance, the entire third contact hole CH3 of the second insulating film 513 may overlap a part of the fourth contact hole CH4 of the third insulating film 514.

The third conductive layer 360 may be disposed on the third insulating film 514.

The third conductive layer 360 may include a transparent conductive material, for example, at least one of Indium Tin Oxide (ITO), Indium Zinc Oxide (IZO), or Indium Gallium Zinc Oxide (IGZO); however, aspects of the present disclosure are not limited thereto.

The third conductive layer 360 may contact the second conductive layer 330 through the third contact hole CH3 of the second insulating film 513 and the fourth contact hole CH4 of the third insulating film 514. In other words, the contact hole 342 of the third and fourth insulating films 513 and 514 that are insulating films disposed between the second conductive layer 330 and the third conductive layer 360 may overlap a part of the second conductive layer 330, and as the third conductive layer 360 is disposed in the contact hole 342 of the third and fourth insulating films 513 and 514, the third conductive layer 360 may contact the second conductive layer 330.

Accordingly, the third conductive layer 360 may be electrically connected to the second conductive layer 330 electrically connected to the first conductive layer 310 and the first active layer 520.

As described above, in the area corresponding to the second node N2 of the driving transistor T1 of the organic light emitting display device 100 according to aspects described herein, the first contact hole CH1 of the buffer layer 511 may overlap a part of the second contact hole CH2 of the first insulating film 512. Further, a part of the first contact hole CH1 of the buffer layer 511 and a part of the second contact hole CH1 of the first insulating film 512 may overlap a part of the third contact hole CH3 of the second insulating film 513 and a part of the fourth contact hole CH4 of the third insulating film 514.

Further, the first conductive layer 310, the first active layer 520, the second conductive layer 330, and the third conductive layer 340 are electrically connected to one another through the contact holes (CH1, CH2, CH3, and CH4).

Meanwhile, FIG. 5 illustrates that the first active layer 520 has a single layer structure; however, aspects of the present disclosure are not limited thereto.

For example, the first active layer 520 may have a multilayer structure of two or more layers. This multilayer structure is discussed in detail with reference to FIG. 6.

Figure 6:
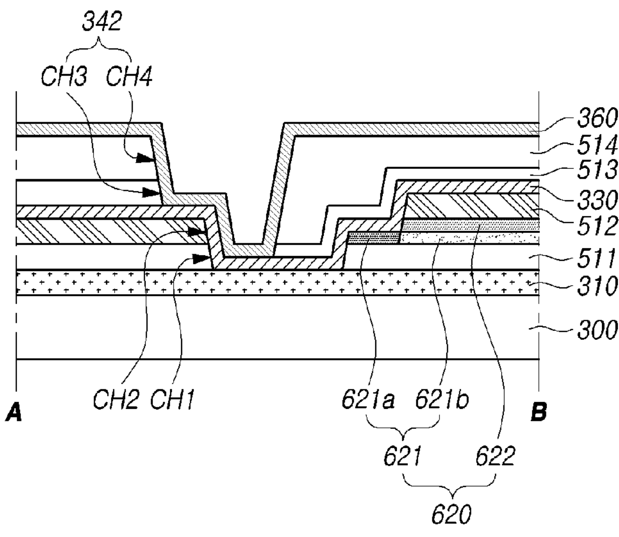
FIG. 6 is a cross-sectional view illustrating an area taken along with line A-B of FIG. 3 in another aspect according to aspects of the present disclosure.

FIG. 6 is a cross-sectional view illustrating an area taken along with line A-B of FIG. 3 in another aspect according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

As shown in FIG. 6, the organic light emitting display device 100 according to aspects described herein includes the first conductive layer 310, the buffer layer 511 including the first contact hole CH1, and an active layer 620, the first insulating film 512 including the second contact hole CH2, the second conductive layer 330, the second insulating film 513 including the third contact hole CH3, and the third insulating film 514 including the fourth contact hole CH4, and the third conductive layer 360.

A first active layer 620 disposed on the buffer layer 511 may include an active pattern 621 and at least one conductive pattern 622 disposed on the active pattern 621.

The active pattern 621 may be formed of an oxide semiconductor. An material included in the first active layer 620 may be a metal oxide semiconductor, and may be formed of i) an oxide of a metal such as molybdenum (Mo), zinc (Zn), indium (In), gallium (Ga), tin (Sn), titanium (Ti), or the like, or ii) an combination of a metal such as molybdenum (Mo), zinc (Zn), indium (In), gallium (Ga), tin (Sn), titanium (Ti), or the like and an oxide of molybdenum (Mo), zinc (Zn), indium (In), gallium (Ga), tin (Sn), titanium (Ti), or the like.

For example, the active pattern 621 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO); however, aspects of the present disclosure are not limited thereto.

The conductive pattern 622 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, aspects of the present disclosure are not limited thereto. For example, the conductive pattern 622 may include an alloy of molybdenum (Mo) and titanium (Ti); however, aspects of the present disclosure are not limited thereto.

The conductive pattern 622 may be disposed on the active pattern 621 to help electrical connection with other components. Further, the conductive pattern 622 may serve as a mask in a conductive process of the active pattern 621, thus serving to help the conductive process of the active pattern 621 without an additional mask.

The first insulating film 512 may be disposed to expose a part of the top surface, and at least one side surface, of the active pattern 621. The first insulating film 512 may be disposed to expose a part of the top surface, and at least one side surface, of the conductive pattern 622.

The conductive pattern 622 may be disposed to expose a part of the top surface, and at least one side surface, of the active pattern 621.

The active pattern 621 may include a conductive area 621*a* and a non-conductive area 621*b*.

The conductive area 621*a* of the active pattern 621 may be, or include, an area not overlapping the first insulating film 512 and the conductive pattern 622. In this aspect, the non-conductive area 621*b* of the active pattern 621 may be an area overlapping the conductive pattern 622.

In another aspect, the conductive area 621*a* of the active pattern 621 may include an area that does not overlap the first insulating film 512 and that overlaps the conductive pattern 622. In this aspect, the non-conductive area 621*b* of the active pattern 621 may overlap the first insulating film 512 and overlap a part of the conductive pattern 622.

In another aspect, a part of the conductive area 621*a* of the active pattern 621 may overlap the first insulating film 512 and the conductive pattern 622. In this aspect, the non-conductive area 621*b* of the active pattern 621 may overlap a part of the first insulating film 512.

The conductive area 621*a* of the active pattern 621 may be formed through the dry etching process for the first insulating film 512 and the buffer layer 511. In this situation, the conductive pattern 622 disposed on the active pattern 621 serves as a mask, thus, an area of the active pattern 621 not overlapping the conductive pattern 622 can be conductive by plasma.

Further, depending on the dry etching process conditions, the conductive area 621*a* of the active pattern 621 may be extended up to a part of an area overlapping the conductive pattern 622.

The extension portion of the conductive area 621*a* of the active pattern 621 may contact the conductive pattern 622. For example, as shown in FIG. 6, when one end of the conductive pattern 622 is located at a boundary between the conductive area 621*a* and the non-conductive area 621*b* of the active pattern 621, the conductive pattern 622 may contact at least a part of the conductive area 621*a* of the active pattern 621 at the boundary between the conductive area 621*a* and the non-conductive area 621*b* of the active pattern 621.

Further, when a part of the conductive area 621*a* of the active pattern 621 overlaps a part of the conductive pattern 622, the conductive pattern 622 may contact a part of the top surface of the conductive area 621*a* of the active pattern 621.

A second conductive layer 330 may be disposed over the substrate 300 over which the first insulating film 512 is disposed.

A part of the second conductive layer 330 may overlap a part of the first active layer 620, and the remaining part of the second conductive layer 330 may not overlap the first active layer 620.

In addition, the second conductive layer 330 may contact a part of the active pattern 621 and a part of the conductive pattern 622 of the first active layer 620 through the second contact hole CH2 provided in the first insulating film 512.

Specifically, the second conductive layer 330 may contact a part of the top surface, and at least one side surface, of the conductive pattern 622 not overlapping the first insulating film 512. Further, the second conductive layer 330 may contact a part of the top surface, and at least one side surface, of the active pattern 621 (i.e. the conductive area 621*a* of the active pattern 621) that does not overlap the conductive pattern 622.

The second conductive layer 330 may contact a part of the top surface of the first conductive layer 310 through the second contact hole CH2 provided in the first insulating film 512 and the first contact hole CH1 provided in the buffer layer 511.

Accordingly, the second conductive layer 330 may be electrically connected to the first conductive layer 310, the active pattern 521 of the first active layer 520, and the conductive pattern 522 through the first contact hole CH1 and the second contact hole CH2.

According to aspects described herein, the resistance of the conductive pattern 622 may be lower than that of the active pattern 621. In this manner, as the conductive pattern 622 is disposed on the active pattern 621, and the second conductive layer 330 is electrically connected to the conductive pattern 622 of the first active layer 620, it is therefore possible to reduce contact resistance.

The second insulating film 513 having the third contact hole CH3 and the third insulating film 514 having the fourth contact hole CH4 may be disposed on or over the second conductive layer 330.

A part of each of the third and fourth contact holes CH3 and CH4 may overlap a part of the first contact hole CH1 and a part of the second contact hole CH2.

As shown in FIG. 6, a part of the second contact hole CH2 overlaps a part of the first active layer 620, but all or one or more, of the first contact hole CH1, the third contact hole CH3, and the fourth contact hole CH4 may not overlap the first active layer 620.

The third conductive layer 360 may be disposed over the substrate over which the first insulating film 513 and the third insulating film 514 are disposed. The third conductive layer 360 may be electrically connected to the second conductive layer 330 through the third contact hole CH3 and the fourth contact hole CH4.

Here, a part of the third conductive layer 360 may contact a part of the second conductive layer 330 in an area in which the third contact hole CH3 and the fourth contact hole CH4 overlap a part of the first contact hole CH1 and a part of the second contact hole CH2, and the remaining, or another, of the third conductive layer 360 may contact a part of the second conductive layer 330 in an area in which the third contact hole CH3 and the fourth contact hole CH4 do not overlap the first contact hole CH1 and the second contact hole CH2.

Meanwhile, in FIGS. 5 and 6, a structure in which one edge of the active layers 320 and 520 overlaps one edge of the buffer layer 411 is illustrated, but structures of the organic light emitting display device 100 according to aspects described herein are not limited thereto.

Hereinafter, discussions will be given in detail on a further structure of the organic light emitting display device 100 according to aspects of the present disclosure.

Figure 7:
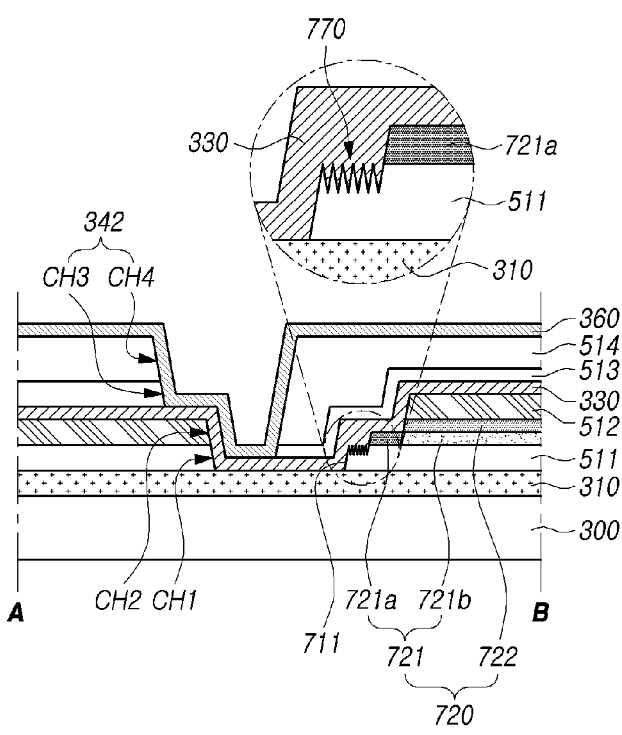
FIG. 7 is a cross-sectional view illustrating an area taken along with line A-B of FIG. 3 in further another aspect according to aspects of the present disclosure.

FIG. 7 is a cross-sectional view illustrating an area taken along with line A-B of FIG. 3 in further another aspect according to the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

Referring to FIG. 7, an active pattern 721 of a first active layer 720 may be disposed on a part of the top surface of a buffer layer 511, and a conductive pattern 722 of the first active layer 720 may be disposed on the active pattern 721.

The active pattern 721 may include a conductive area 721*a* and a non-conductive area 721*b*.

The active pattern 721 and the conductive pattern 722 may be disposed to expose a part of the top surface of the buffer layer 511. The conductive pattern 722 may be disposed to expose a part of the top surface, and at least one side surface, of the active pattern 721.

The buffer layer 511 may include the first contact hole CH1 exposing a part of the top surface of the first conductive layer 310. A part of the top surface of an extension portion extending from the one side surface 711 of the buffer layer 511 corresponding to the inside of the first contact hole CH1 may not overlap the active pattern 721 and the conductive pattern 722 of the first active layer 720, and may not also overlap the first insulating film 512 disposed on the first active layer 720.

A plurality of protrusions 770 may be disposed in at least a part of the top surface of the extension portion not overlap the first active layer 720 and the first insulating film 512 and extending from the one side surface 711 of the buffer layer 511 formed by the first contact hole CH1.

The shape of the plurality of protrusions 770 may be irregular; however, aspects of the present disclosure are not limited thereto.

The plurality of protrusions 770 may be formed through the dry etching process for forming the second contact hole CH2 of the first insulating film 512.

Specifically, before the first insulating film 512 is formed, a material of the active pattern 721 and a material of the conductive pattern 722 may be sequentially deposited on a material of the first buffer layer 511 in which the first contact hole CH1 is not formed.

Further, after patterning the conductive pattern 722 using wet etching, the first active layer 720 including the active pattern 721 remaining in a non-conductive state may be formed through a process of patterning the material of the active pattern 721 using wet etching.

In this situation, as the conductive pattern 722 is disposed on the active pattern 721, this serves to prevent the active pattern 721 from being completely removed by an etching solution in the process of patterning the material of the active pattern 721, and enables the material forming the active pattern 721 to be patterned, thereby enabling the active pattern 721 to be formed under the conductive pattern 722. That is, the process stability of the first active layer 720 may be improved by the conductive pattern 722.

As described above, when patterning the active pattern 721 using wet etching, an outer edge of the active pattern 721 may have a very thin thickness due to the influence of the etching solution.

Thereafter, after depositing the material of the first insulating film 512 on the first active layer 720 including the active pattern 721 remaining in the non-conductive state and the conductive pattern 722, the first and second contact holes CH1 and CH2 may be formed substantially simultaneously by performing dry etching for the material of the first insulating film 512 and the material of the buffer layer 511.

In the dry etching process of removing the material of the first insulating film 512, the first contact hole CH1 of the buffer layer 511 may be formed by removing the material of the buffer layer 711 located in an area corresponding to an area in which the active pattern 721 is not disposed.

In addition, the outer edge of the active pattern 721 (having the thin thickness) may be removed by plasma to expose a part of the top surface of the buffer layer 511. Accordingly, the plurality of protrusions 770 may be formed on a part of the top surface of the buffer layer 511 adjacent to the first contact hole CH1 by plasma.

In other words, in the process of forming the first contact hole CH1 in the buffer layer 511, as the material of the active pattern 721 having the thin thickness is maintained in a part of the top surface of the extension portion extending from the one side surface 711 of the buffer layer 511 formed by the first contact hole CH1 shown in FIG. 7, a plurality of protrusions 770 may be formed on the top surface of the buffer layer 511 through the removing of the active pattern 721 having the thin thickness in which the first contact hole CH1 is not formed.

Further, in the process of forming the first and second contact holes CH1 and CH2, a part of the material of the active pattern 721 that is not removed and exposed by the plasma may become conductive, and act as the conductive area of the active pattern 721.

FIG. 7 illustrates a structure in which the conductive area 721*a* of the active pattern 721 is an area that does not overlap the first insulating film 512, and the non-conductive area 721*b* of the active pattern 721 is an area overlapping the first insulating film 512; however, aspects of the present disclosure are not limited thereto. Herein, depending on process conditions of dry etching, there may be provided a structure in which a part of the conductive area 721*a* of the active pattern 721 overlaps the first insulating film 512.

The conductive area 721*a* of the active pattern 721 may be electrically connected to, by contacting, a part of the conductive pattern 722.

The second conductive layer 330 may be disposed on or over the buffer layer 511, the first active layer 720, and the first insulating film 512.

The second conductive layer 330 may contact a part of the top surface, and at least one side surface, of the active pattern 722 of the first active layer 720 through the second contact hole CH2 provided in the first insulating film 512. The second conductive layer 330 may contact a part of the top surface, and at least one side surface, of the conductive pattern 721*a* of the active pattern 721 of the first active layer 720 through the second contact hole CH2 provided in the first insulating film 512.

The second conductive layer 330 may make contact with the surfaces of all or some of the plurality of protrusions 770 disposed on a part of the top surface of the buffer layer 511.

The second insulating film 513 including the third contact hole CH3 and the third insulating film 513 including the fourth contact hole CH4 may be disposed on the second conductive layer 330.

A part of each of the third and fourth contact holes CH3 and CH4 may overlap a part of the first contact hole CH1 of the buffer layer 511 and a part of the second contact hole CH2. The remaining part of each of the third contact hole CH3 and the fourth contact hole CH4 may not overlap the first and second contact holes CH1 and CH2.

The third contact hole CH3 and the fourth contact hole CH4 may not overlap the plurality of protrusions 770 of the buffer layer 511. The plurality of protrusions 770 of the buffer layer 511 may not overlap the first contact hole CH1, but may overlap a part of the second contact hole CH2.

The third conductive layer 360 may be disposed on the third insulating film 513.

The third conductive layer 360 may be electrically connected to the second conductive layer 330 through the third contact hole CH3 and the fourth contact hole CH4.

Meanwhile, in the area corresponding to the second node N2 of the driving transistor T1 of FIG. 2, structures in which the buffer layer 511, the first active layer (320, 520, 620, and 720), the first insulating film 512, and the second conductive layer 330 of the organic light emitting display device 100 according to aspects described herein are disposed are not limited to structures illustrated in FIGS. 5 to 7; thus, may be variously formed.

Hereinafter, with reference to FIGS. 8 and 10, discussions will be given on other structures of the organic light emitting display device according to aspects of the present disclosure.

Figure 8:
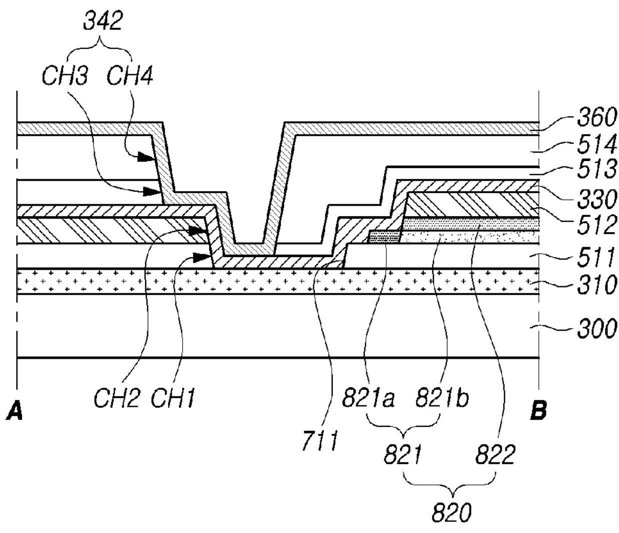
FIGS. 8 to 10 illustrate various aspects for arrangements of a buffer layer, a first active layer, a first insulating film, and a second conductive layer in the organic light emitting display device according to aspects of the present disclosure.
Figure 9:
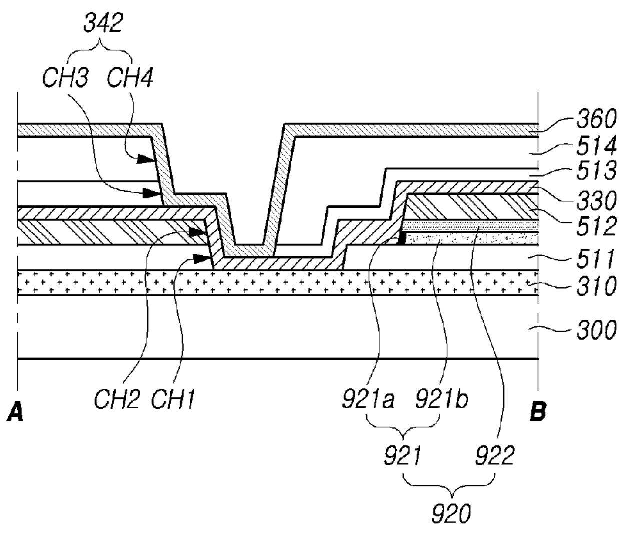
Figure 10:
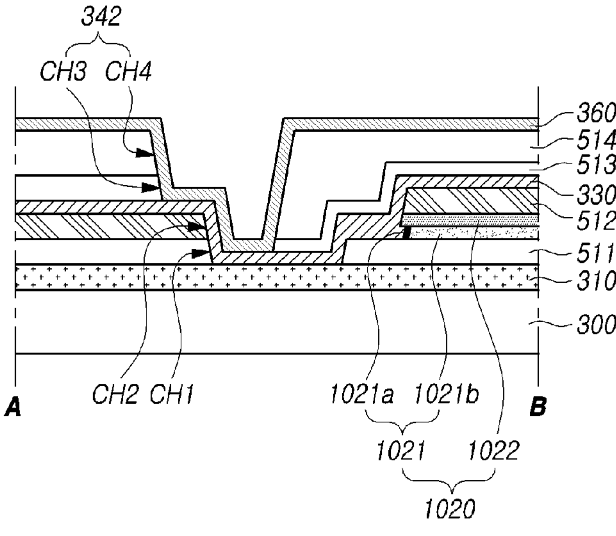

FIGS. 8 to 10 illustrate various aspects for arrangements of a buffer layer, a first active layer, a first insulating film, and a second conductive layer in the organic light emitting display device according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

Referring to FIG. 8, an active pattern 821 of a first active layer 820 may be disposed on a part of the top surface of the buffer layer 511, and a conductive pattern 822 of the first active layer 820 may be disposed on the active pattern 821.

The active pattern 821 may include a conductive area 821*a* and a non-conductive area 821*b*. FIG. 8 illustrates a structure in which the conductive area 821*a* of the active pattern 821 is an area that does not overlap the first insulating film 512, and the non-conductive area 821*b* of the active pattern 821 is an area overlapping the first insulating film 512; however, aspects of the present disclosure are not limited thereto. Herein, depending on process conditions, there may be provided a structure in which a part of the conductive area 821*a* of the active pattern 821 overlaps the first insulating film 512.

A part of the conductive pattern 822 may contact a part of the conductive area 821*a* of the active pattern 821.

The active pattern 821 and the conductive pattern 822 may be disposed to expose a part of the top surface of the buffer layer 511. The conductive pattern 822 may be disposed to expose a part of the top surface, and at least one side surface, of the active pattern 821.

The buffer layer 511 may include the first contact hole CH1 exposing a part of the top surface of the first conductive layer 310. A part of the top surface of an extension portion extending from the one side surface 711 of the buffer layer 511 formed by the first contact hole CH1 may not overlap the active pattern 821 and the conductive pattern 822 of the first active layer 820, and may not also overlap the first insulating film 512 disposed on the first active layer 820.

The second conductive layer 330 may contact surfaces of the first active layer 820 and the buffer layer 511 not overlapping the first insulating layer 512.

The second conductive layer 330 may contact a part of the conductive area 821*a* of the first active layer 820 and a part of the conductive pattern 822 through the second contact hole CH2 of the first insulating film 512.

The process of forming the first contact hole CH1 of the buffer layer 511 and the second contact hole CH2 of the first insulating film 512 shown in FIG. 8 may be equal to the process described with reference to FIG. 7.

Comparing with the structure of FIG. 7, in the structure of FIG. 8, according to the process conditions of forming the first contact hole CH1 of the buffer layer 511 and the second contact hole CH2 of the first insulating film 512, a protrusion may not be formed in a part of the top surface of the extension portion not overlapping the first active layer 820 and the first insulating film 512 and extending from the one side surface 711 of the buffer layer 511.

The second insulating film 513 including the third contact hole CH3 and the third insulating film 513 including the fourth contact hole CH4 may be disposed on or over the second conductive layer 330.

The third and fourth contact holes CH3 and CH4 may overlap a part of the first contact hole CH1 of the buffer layer 511 and a part of the second contact hole CH2.

The third conductive layer 360 may be disposed on the third insulating film 513.

The third conductive layer 360 may be electrically connected to the second conductive layer 330 through the third contact hole CH3 and the fourth contact hole CH4.

Meanwhile, although FIGS. 6 to 8 illustrate structures in which a part of the top surface of the active pattern (621, 721, or 821) of the first active layer (620, 720, or 820) does not overlap the conductive pattern (622, 722, or 822); however, aspects of the present disclosure are not limited thereto.

Referring to FIG. 9, at least one outer edge of an active pattern 921 of a first active layer 920 may overlap an outer edge of conductive pattern 922 thereof.

In this aspect, after depositing a material of the active pattern 921 on a material of the buffer layer 511, a material of the conductive pattern 922 may be deposited on the material of the active pattern 921, and then the material of the conductive pattern 922 may be patterned by wet etching using a photoresist.

Thereafter, by wet etching and patterning the material of the active pattern 921 using the photoresist and the conductive pattern 922, the active pattern 921 and the conductive pattern 922 of the first active layer 920 may be formed as shown in FIG. 9. Specifically, one outer edge of the photoresist pattern may overlap one outer edge of the conductive pattern 922, and when the material of the active pattern 921 is wet-etched using the photoresist pattern and the conductive pattern 922 as a mask, the outer edge of the conductive pattern 922 and the outer edge of the active pattern 921 may overlap as shown in FIG. 9.

Further, the top surface of the active pattern 921 remaining in a non-conductive state may be covered by the conductive pattern 922, and a side surface of the active pattern 921 may not be covered by the conductive pattern 922 and may exist in an exposed state.

Thereafter, after removing the photoresist pattern disposed on the conductive pattern 922, the material of the first insulating film 512 may be deposited.

The second contact hole CH2 may be formed in the first insulating film 512 through the dry etching process, and at the same time, the first contact hole CH2 may be formed in the buffer layer 511. In this process, a side surface of the active pattern 921 that is not covered by the conductive pattern 922 may become conductive by plasma.

By changing conditions such as the dry etching process time and a magnitude of plasma energy, the inside of the active pattern 921 may become conductive, as well as the surface forming the side surface of the active pattern 921.

In this manner, the active pattern 921 may include a conductive area 921*a* and a non-conductive area 921*b*.

The conductive pattern 922 may overlap the conductive area 921*a* of the active pattern 921 corresponding to at least one side of the active pattern 921. Thus, the conductive area 921*a* of the active pattern 921 may be electrically connected to a part of the conductive pattern 922.

The first insulating film 512 may be disposed on the first active layer 920, and the second conductive layer 330 may be disposed on the first insulating film 512.

The second conductive layer 330 may contact a part of the top surface, and at least one side surface, of the active pattern 922 of the first active layer 920 through the second contact hole CH2 formed in the first insulating film 512. Further, the second conductive layer 330 may make contact the conductive area 921*a* of the active pattern 921 of the first active layer 920.

The second insulating film 513 including the third contact hole CH3 and the third insulating film 513 including the fourth contact hole CH4 may be disposed on the second conductive layer 330.

The third and fourth contact holes CH3 and CH4 may overlap a part of the first contact hole CH1 of the buffer layer 511 and a part of the second contact hole CH2.

The third conductive layer 360 may be disposed on the third insulating film 513.

The third conductive layer 360 may be electrically connected to the second conductive layer 330 through the third contact hole CH3 and the fourth contact hole CH4.

Next, referring to FIG. 10, an active pattern 1021 of a first active layer 1020 may be disposed to expose a part of the rear surface of the conductive pattern 1022.

The first active layer 1020 having the structure in which the active pattern 1021 exposes the part of the rear surface of the conductive pattern 1022 may be formed through the process described in FIG. 9.

Comparing with the structure of FIG. 9, in the structure of FIG. 10, as the material of the active pattern 1021 may be over-etched by an etching solution in the wet etching process for the material of the active pattern 1021 using a photoresist pattern and the conductive pattern 1022, taking account of this situation, a structure is provided in which the active pattern 1021 is allowed to expose a part of the rear surface of the conductive pattern 1022.

After depositing the first active layer 1020, in the dry etching process of forming the second contact hole CH2 in the first insulating layer 512 and forming the first contact hole CH1 in the buffer layer 511, a side surface of the active pattern 1021 that is not covered by the conductive pattern 1022 may become conductive by plasma. In particular, since plasma does not have only linearity, and even when the side surface of the active pattern 1021 has a structure overlapping the conductive pattern 1022, the conductive pattern 1022 does not contact the side surface of the active pattern 1021, the side surface of the active pattern 1021 may become conductive by plasma.

In this situation, the top surface of the active pattern 1021 remaining in the non-conductive state may be covered by the conductive pattern 1022, and a side surface of the active pattern 1021 may not be covered by the conductive pattern 1022 and may exist in an exposed state.

The active pattern 1021 may include a conductive area 1021*a* and a non-conductive area 921*b*. The conductive area 1021*a* of the active pattern 1021 may be an area corresponding to at least one side surface of the active pattern 1021, and the remaining area may be a non-conductive area 1021*b*.

A boundary area between the one side surface and the top surface of the active pattern 1021 may also become conductive, and the rear surface of the conductive pattern 1022 may contact the boundary area between the one side surface and the top surface of the active pattern 1021.

The first insulating film 512 may be disposed on the first active layer 1020, and the second conductive layer 330 may be disposed on the first insulating film 512.

The second conductive layer 330 may contact one or more parts of the top surface, at least one side, and/or the rear surface, of the conductive pattern 1022 of the first active layer 1020 through the second contact hole CH2 provided in the first insulating film 512.

The second conductive layer 330 may contact a side surface of the active pattern 1021 that is the conductive area 1021*a* of the active pattern 1021 of the first active layer 1020 through the second contact hole CH2 formed in the first insulating film 512.

That is, even when the active pattern 1021 is over-etched by the process of forming the elements disposed over the substrate 300 to expose a part of the rear surface of the conductive pattern 1022, as the conductive pattern 1011 may contact one side surface of the active pattern 1021 that is the conductive area 1021*b* of the active pattern 1021, and the second conductive layer 330 may contact the first active layer 1020, this structure can lead to easily driving an associated subpixel.

The second insulating film 513 including the third contact hole CH3 and the third insulating film 513 including the fourth contact hole CH4 may be disposed on the second conductive layer 330.

The third and fourth contact holes CH3 and CH4 may overlap a part of the first contact hole CH1 of the buffer layer 511 and a part of the second contact hole CH2.

The third conductive layer 360 may be disposed on the third insulating film 513.

The third conductive layer 360 may be electrically connected to the second conductive layer 330 through the third contact hole CH3 and the fourth contact hole CH4.

Next, another structure for an area included in a second node N2 of a driving transistor T1 in a sub-pixel of the organic light emitting display device 100 according to aspects described herein will be described with reference to the drawings.

Figure 11:
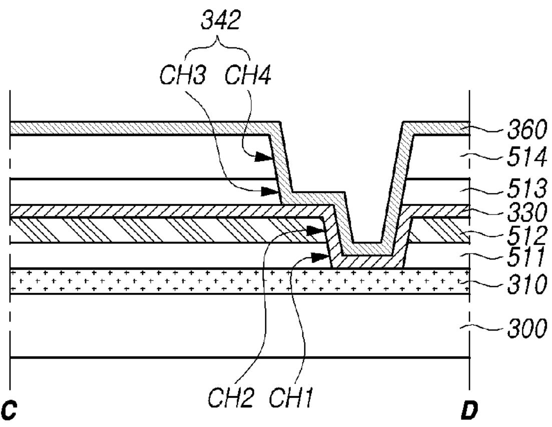
FIG. 11 is a cross-sectional view taken along with line C-D of FIG. 3 according to aspects of the present disclosure.

FIG. 11 is a cross-sectional view taken along with line C-D of FIG. 3 according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

In the following description, a first active layer will be described based on a structure to which the first active layer 620 shown in FIG. 6 is applied.

Referring to FIG. 11, the first conductive layer 310 may be disposed on the substrate 300.

The buffer layer 511 may be disposed on the first conductive layer 310.

The buffer layer 511 may include the first contact hole CH1 exposing a part of the top surface of the first conductive layer 310.

The first insulating film 512 may be disposed on the buffer layer 511.

The first insulating film 512 may include the second contact hole CH2 overlapping the first contact hole CH1.

The second conductive layer 330 may be disposed on the first insulating film 512.

The second conductive layer 330 may contact a part of the top surface of the first conductive layer 310 through the first contact hole CH1 of the buffer layer 511 and the second contact hole CH2 of the first insulating film 512.

The second insulating film 513 may be disposed on the second conductive layer 330.

The second insulating film 513 may include the third contact hole CH3 overlapping the first contact hole CH1 and the second contact hole CH2.

The third contact hole CH3 may expose a part of the top surface of the second conductive layer 330. Specifically, the third contact hole CH3 may overlap the entire second conductive layer 330 disposed in the first contact hole CH1 and the second contact hole CH2, and overlap a part of the second conductive layer 330 disposed in a part of the top surface of the first insulating film 512 surrounds the second contact hole CH2.

The third insulating film 514 may be disposed on the second insulating film 315.

The third insulating film 514 may include a fourth contact hole CH4 overlapping the third contact hole CH3.

The fourth contact hole CH4 may overlap the third contact hole CH3 to expose a part of the top surface of the second conductive layer 330. Specifically, the fourth contact hole CH4 may overlap the entire second conductive layer 330 disposed in the first contact hole CH1 and the second contact hole CH2, and overlap a part of the second conductive layer 330 disposed in a part of the top surface of the first insulating film 512 surrounds the second contact hole CH2.

The third conductive layer 360 may be disposed on the third insulating film 514.

The third conductive layer 360 may contact a part of the top surface of the second conductive layer 330 through the third contact hole CH3 and the fourth contact hole CH4.

Specifically, the third conductive layer 360 may contact the second conductive layer 330 disposed in the first contact hole CH1 and the second contact hole CH2, and may also overlap a part of the second conductive layer 330 disposed on a part of the top surface of the first insulating film 512 surrounding the second contact hole CH2.

That is, in an area cut along C-D of FIG. 3, the first conductive layer 310, the second conductive layer 330, and the third conductive layer 360 may be electrically connected.

Further, as shown in FIG. 11, in an area cut along C-D of FIG. 3, the first active layer may not be disposed. That is, it can be seen that an area where the first to fourth contact holes CH1, CH2, CH3, and CH4 overlap and the first active layer do not overlap.

Meanwhile, when an area in which a plurality of contact holes overlap, such as a structure in which the first to fourth contact holes CH1, CH2, CH3, and CH4 overlap, overlaps the first active layer or the second active layer described in the structure shown in FIG. 3, there is a probability that the first active layer or the second active layer may be damaged in the process of forming the plurality of contact holes, or as the first or second active layer is over-etched, respective parts of insulating films including the first to fourth contact holes CH1, CH2, CH3 and CH4 may be exposed and these insulating films may be therefore damaged.

In particular, when a part of at least one element disposed over the substrate 300 is patterned through the wet etching process, unintended over-etching of an associated active layer may occur due to an etching solution, and thus the buffer layer 511 disposed under the active layer may also be damaged. For example, structural defects such as a situation where the first contact hole CH1 having an excessively large size is formed may occur.

However, in the organic light emitting display device 100 according to aspects described herein, not only an area where the third and fourth contact holes CH3 and CH4 overlap, but also an area where the first to fourth contact holes CH1, CH2, CH3, and CH4 overlap does not overlap the first active layer, and thus, it is possible to prevent the buffer layer from being damaged due to over-etching of the active layer.

Further, as mentioned above, as the entire first contact hole CH1 overlaps the second contact hole CH2, and the first contact hole CH1 and the second contact hole CH2 overlap the third contact hole CH3 and the fourth contact hole CH4, an area occupied by the plurality of contact holes can be reduced, and thus, a size of a storage capacitor located in an associated sub-pixel can be increased.

The storage capacitor of the organic light emitting display device 100 according to aspects described herein can include a multi-layered electrode, and thereby, the storage capacitor having high capacity characteristics can be implemented.

A structure of a storage capacitor according to aspects described herein will be discussed with reference to FIG. 12.

Figure 12:
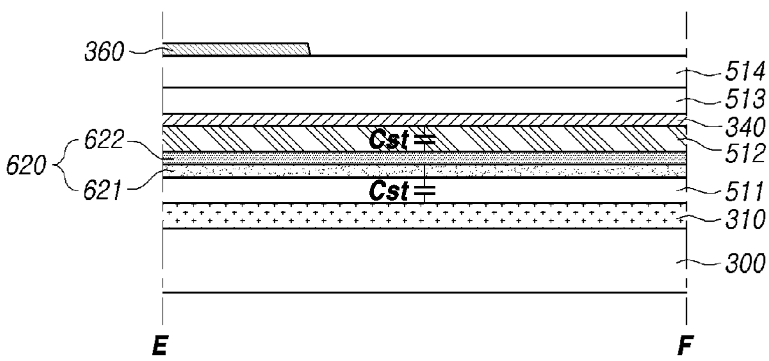
FIG. 12 is a cross-sectional view taken along with line E-F of FIG. 3 according to aspects of the present disclosure.

FIG. 12 is a cross-sectional view taken along with line E-F of FIG. 3 according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

In the following description, a first active layer will be described based on a structure to which the first active layer 620 shown in FIG. 6 is applied.

Referring to FIG. 12, the first conductive layer 310, the buffer layer 511, the active pattern 621 of the first active layer 620, and the conductive pattern 622 of the first active layer 620, the first insulating film 512, the plate 340, the second insulating film 513, the third insulating film 514, and the third conductive layer 360 may be sequentially disposed over the substrate 300.

The plate 340 may be disposed in the same layer as the second conductive layer 330 as described above.

In a situation where one or more layers including an inorganic insulating material are disposed between the first conductive layer 310, the active pattern 621 of the first active layer 620, and the plate 340, each of the first conductive layer 310, the active pattern 621 of the first active layer 620, and the plate 340 are disposed to overlap each other, thereby acting as an electrode of the storage capacitor.

According to aspects described herein, since the first active layer 620 includes the conductive pattern 622, and most of the area in which the plate 340, the first active layer 620, and the first conductive layer 310 overlap is utilized as the storage capacitor Cst, thus, the organic light emitting display device 100 having high-resolution can be implemented.

Although FIG. 12 shows the structure in which the first active layer 620 includes the conductive pattern 621; however, as shown in FIG. 5, the first active layer 520 may have a structure including only the active pattern. In this situation, an area of the active pattern in an area where the storage capacitor is disposed may be a conductive area.

As the storage capacitor of the organic light emitting display device 100 according to aspects described herein has a multi-layer structure, thereby, the storage capacitor having high capacity characteristics can be implemented.

According to aspects of the present disclosure, as the plurality of contact holes disposed in the area in which the second node of the driving transistor is located are disposed to overlap, and thus, a size of the conductive layer overlapping the plurality of contact holes can be reduced, it is therefore possible to provide the organic light emitting display panel having high luminance characteristics and the organic light emitting display device including the display panel by enabling an area of a non-light emitting area to be reduced without reducing an area of the storage capacitor, and an area of a light emitting area to be increased relative to the reduction of the area of the non-light emitting area.

Further, according to aspects of the present disclosure, as the plurality of contact holes disposed in the area in which the second node of the driving transistor is located overlap, and thus, a size of the conductive layer overlapping the plurality of contact holes can be reduced, a size or capacity of the storage capacitor can be therefore increased without reducing an area of the light emitting area, and as a result, it is possible to provide the organic light emitting display panel having high luminance and high resolution and the organic light emitting display device including the display panel.

Further, according to aspects of the present disclosure, as the active layer includes the active pattern and the conductive pattern disposed on the active pattern, it is possible to provide the organic light emitting display panel in which sub-pixels can be easily driven and the organic light emitting display device including the display panel.

Further, according to aspects of the present disclosure, as the active layer does not overlap a part of the area in which the plurality of contact holes are formed, it is possible to provide the organic light emitting display panel having a structure capable of preventing the active layer or the buffer layer from being damaged in an associated process and the organic light emitting display device including the display panel.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. An organic light emitting display device comprising:

a substrate;

a first conductive layer disposed on the substrate;

a buffer layer disposed on the first conductive layer and having a first contact hole overlapping with a part of the first conductive layer;

an active layer disposed on the buffer layer;

a first insulating film disposed on or over the active layer and the buffer layer and having a second contact hole overlapping with the first contact hole;

a second conductive layer disposed on the first insulating film and having a first region directly contacting a part of the first conductive layer through the first contact hole and the second contact hole and a second region contacting a part of the active layer;

a second insulating film disposed on the second conductive layer and having a third contact hole overlapping with a part of each of the first contact hole and the second contact hole; and a third conductive layer disposed on the second insulating film and, within the second contact hole, directly contacting only a partial region of the second conductive layer, wherein the third contact hole does not overlap with the active layer, wherein the first, second and third conductive layers contact with one another only at a commonly overlapping portion of the first, second and third contact holes, wherein the second conductive layer includes a region inside the first contact hole in which it does not contact the third conductive layer with the second insulating layer interposed therebetween, wherein the third contact hole does not overlap with the active layer of any sub-pixel of the organic light emitting display device, and wherein the first region and the second region being formed to extend so as to be electrically connected to each other.

2. The organic light emitting display device according to claim 1, wherein the first contact hole does not overlap with the active layer.

3. The organic light emitting display device according to claim 1, wherein the active layer comprises at least one of zinc oxide ZnO, zinc-tin oxide ZTO, zinc-indium oxide ZIO, indium oxide InO, titanium oxide TiO, indium-gallium-zinc oxide IGZO, and indium-zinc-tin oxide IZTO, and wherein an area in which the active layer overlaps with the second contact hole is an conductive area.

4. The organic light emitting display device according to claim 1, wherein the active layer comprises an active pattern disposed on the buffer layer and at least one layer of a conductive pattern disposed on the active pattern, and wherein the active pattern comprises at least one of zinc oxide (ZnO), zinc-tin oxide ZTO, zinc-indium oxide ZIO, indium oxide InO, titanium oxide TiO, indium-gallium-zinc oxide IGZO, and indium-zinc-tin oxide IZTO, and wherein the conductive pattern comprises any one of either a metal such as aluminum Al, gold Au, silver Ag, copper Cu, tungsten W, molybdenum Mo, chromium Cr, tantalum Ta, or titanium Ti, or an alloy two or more of aluminum Al, gold Au, silver Ag, copper Cu, tungsten W, molybdenum Mo, chromium Cr, tantalum Ta, or titanium Ti.

5. The organic light emitting display device according to claim 4, wherein the conductive pattern serves as a mask during a conductive process of the active pattern.

6. The organic light emitting display device according to claim 5, wherein the conductive pattern does not cover a top surface and at least one side surface of a conductive area of the active layer, thereby exposing the top surface and the at least one side surface of the conductive area of the active layer during the conductive process of the active pattern.

7. The organic light emitting display device according to claim 4, wherein at least one outer edge of the conductive pattern overlaps with an outer edge of the active pattern.

8. The organic light emitting display device according to claim 4, wherein the active pattern exposes a part of a rear surface of the conductive pattern.

9. The organic light emitting display device according to claim 1, wherein the active layer exposes a part of a top surface of the buffer layer, and the part of the top surface of the buffer layer exposed by the active layer comprises a plurality of protrusions.

10. The organic light emitting display device according to claim 1, wherein the active layer comprises a conductive area, and the conductive area is an area in which the active layer does not overlap with the first insulating film, or an area including the area in which the active layer does not overlap with the first insulating film and a part of an area in which the active layer overlaps with the first insulating film.

11. The organic light emitting display device according to claim 1, further comprising a plate disposed in a same layer as the second conductive layer and spaced apart from the second conductive layer, wherein the plate forms a storage capacitor by overlapping with a part of the first conductive layer and the part of the active layer.

12. The organic light emitting display device according to claim 11, wherein the plate comprises a first extension portion overlapping with the part of the active layer, and the first extension portion is a gate electrode of a driving transistor in sub-pixel of the organic light emitting display device.

13. The organic light emitting display device according to claim 12 wherein an area in which the first contact hole, the second contact hole, and the third contact hole are disposed is an area including a node at which a reference voltage is applied to the driving transistor.

14. The organic light emitting display device according to claim 1, wherein the third conductive layer is an anode electrode or a cathode electrode of an organic light emitting element.

15. The organic light emitting display device according to claim 1, wherein an area in which two or more of the first contact hole, the second contact hole, and the third contact hole overlap with each other does not overlap with the active layer.

16. An organic light emitting display panel comprising:

a substrate;

a first conductive layer disposed on the substrate;

a buffer layer disposed on the first conductive layer and including a first contact hole overlapping with a part of the first conductive layer;

an active layer including an active pattern disposed on the buffer layer and a conductive pattern disposed on the active pattern;

a first insulating film disposed on or over the active layer and the buffer layer and including a second contact hole overlapping with the first contact hole;

a second conductive layer disposed on the first insulating film, and having a first region directly contacting a part of the first conductive layer through the first contact hole and the second contact hole and a second region contacting a part of the active layer;

a plate disposed in a same layer as the second conductive layer and spaced apart from the second conductive layer; and a second insulating film disposed on or over the second conductive layer and the plate, and including a third contact hole overlapping with a part of each of the first contact hole and the second contact hole;

a third conductive layer disposed on the second insulating film;

wherein the third contact hole does not overlap with the active layer, wherein one or more of the first conductive layer, the active layer, and the plate serves as an electrode of a storage capacitor, wherein the first, second and third conductive layers contact with one another only at a commonly overlapping portion of the first, second and third contact holes, wherein the second conductive layer includes a region inside the first contact hole in which it does not contact the third conductive layer with the second insulating layer interposed therebetween, wherein the third contact hole does not overlap with the active layer of any sub-pixel of the organic light emitting display device, wherein the third conductive layer, within the second contact hole, directly contacting only a partial region of the second conductive layer, and wherein the first region and the second region being formed to extend so as to be electrically connected to each other.

17. The organic light emitting display panel according to claim 16, wherein the storage capacitor comprises the conductive pattern of the active layer as an electrode of the storage capacitor.

18. The organic light emitting display panel according to claim 16, wherein the first contact hole does not overlap with the active layer.

19. The organic light emitting display panel according to claim 16, wherein an area in which the first contact hole, the second contact hole, and the third contact hole are disposed is an area including a node at which a reference voltage is applied to a driving transistor in sub-pixel of the organic light emitting display panel.

* * * * *